(12) United States Patent
Takaki et al.

(10) Patent No.: US 11,805,654 B2
(45) Date of Patent: Oct. 31, 2023

(54) SEMICONDUCTOR DEVICE

(71) Applicant: SAMSUNG ELECTRONICS CO., LTD., Suwon-si (KR)

(72) Inventors: Sejie Takaki, Suwon-si (KR); JoonHee Lee, Seongnam-si (KR)

(73) Assignee: SAMSUNG ELECTRONICS CO, LTD., Suwon-si (KR)

( * ) Notice: Subject to any disclaimer, the term of this patent is extended or adjusted under 35 U.S.C. 154(b) by 224 days.

(21) Appl. No.: 17/207,208

(22) Filed: Mar. 19, 2021

(65) Prior Publication Data
US 2021/0408027 A1    Dec. 30, 2021

(30) Foreign Application Priority Data
Jun. 24, 2020    (KR) .................. 10-2020-0077218

(51) Int. Cl.
| | |
|---|---|
| *H10B 43/40* | (2023.01) |
| *H01L 23/522* | (2006.01) |
| *H01L 23/528* | (2006.01) |
| *H01L 23/535* | (2006.01) |
| *H01L 21/768* | (2006.01) |
| *H10B 41/27* | (2023.01) |
| *H10B 41/41* | (2023.01) |
| *H10B 43/27* | (2023.01) |

(52) U.S. Cl.
CPC ....... *H10B 43/40* (2023.02); *H01L 21/76805* (2013.01); *H01L 21/76843* (2013.01); *H01L 21/76895* (2013.01); *H01L 23/5226* (2013.01); *H01L 23/5283* (2013.01); *H01L 23/535* (2013.01); *H10B 41/27* (2023.02); *H10B 41/41* (2023.02); *H10B 43/27* (2023.02)

(58) Field of Classification Search
CPC .......... H01L 27/11529; H01L 23/5226; H01L 23/535
See application file for complete search history.

(56) References Cited

U.S. PATENT DOCUMENTS

| | | | |
|---|---|---|---|
| 9,653,562 | B2 | 5/2017 | Kim et al. |
| 9,876,031 | B1* | 1/2018 | Shimizu ............ H01L 29/42344 |
| 10,381,373 | B2 | 8/2019 | Okizumi et al. |
| 10,396,090 | B2 | 8/2019 | Lee |
| 2017/0222141 | A1* | 8/2017 | BrightSky ............ H01L 45/124 |

(Continued)

*Primary Examiner* — Matthew L Reames
*Assistant Examiner* — Fakeha Sehar
(74) *Attorney, Agent, or Firm* — F. CHAU & ASSOCIATES, LLC

(57) ABSTRACT

A semiconductor device includes a peripheral circuit region with a first substrate, circuit devices on the first substrate, and a first wiring structure, a memory cell region with a second substrate that has a first region and a second region, gate electrodes stacked in the first region, channel structures that penetrate the gate electrodes, a first horizontal conductive layer on the second substrate in the first region, an insulating region on the second substrate in the second region, a second horizontal conductive layer on the first horizontal conductive layer and the insulating region, and a second wiring structure, and a third wiring structure that connects the first substrate to the second substrate, and includes an upper via that penetrates the second horizontal conductive layer, the insulating region, and the second substrate, and a lower wiring structure connected to the upper.

13 Claims, 28 Drawing Sheets

(56) References Cited

U.S. PATENT DOCUMENTS

| | | |
|---|---|---|
| 2018/0247951 A1 | 8/2018 | Fujii et al. |
| 2018/0323207 A1 | 11/2018 | Shim et al. |
| 2019/0081061 A1* | 3/2019 | Tessariol ........... H01L 21/76877 |
| 2019/0115363 A1 | 4/2019 | Choi |
| 2019/0198524 A1 | 6/2019 | Fujiki et al. |
| 2019/0237475 A1* | 8/2019 | Jung ................... H01L 29/4234 |
| 2020/0027835 A1* | 1/2020 | Hsu ................... H01L 27/11582 |
| 2021/0134819 A1* | 5/2021 | Zhang ............... H01L 27/11548 |

* cited by examiner

SEMICONDUCTOR DEVICE

CROSS-REFERENCE TO RELATED APPLICATION(S)

This application claims priority under 35 USC § 119 from, and the benefit of Korean Patent Application No. 10-2020-0077218, filed on Jun. 24, 2020 in the Korean Intellectual Property Office, the contents of which are herein incorporated by reference in their entirety.

BACKGROUND

Exemplary embodiments of the present disclosure are directed to a semiconductor device.

As semiconductor devices have been reduced in volume and process high capacity data, the integration density of semiconductor devices has increased. One method for improving integration density of a semiconductor device involves having a vertical transistor structure, instead of a general planar transistor structure.

SUMMARY

An exemplary embodiment of the present disclosure provides a semiconductor device that has improved reliability.

According to an exemplary embodiment of the present disclosure, a semiconductor device includes a peripheral circuit region that includes a first substrate, circuit devices disposed on the first substrate, and a first wiring structure electrically connected to the circuit devices, a memory cell region that includes a second substrate disposed above the first substrate and that has a first region and a second region, gate electrodes that are stacked in a first direction perpendicular to an upper surface of the second substrate and spaced apart from each other in the first region and that extend in a second direction perpendicular to the first direction and form a staircase shape in the second region, interlayer insulating layers alternately stacked with the gate electrodes, channel structures that penetrate the gate electrodes, extend perpendicular to the second substrate, and include a channel layer, a first horizontal conductive layer disposed on the second substrate in the first region, an insulating region disposed side by side with the first horizontal conductive layer on the second substrate in the second region, a second horizontal conductive layer on the first horizontal conductive layer and the insulating region, and a second wiring structure electrically connected to the gate electrodes and the channel structures, and a third wiring structure that connects the first substrate to the second substrate, and that includes an upper via that extends in the first direction and penetrates the second horizontal conductive layer, the insulating region, and the second substrate, and a lower wiring structure below the upper via and connected to the upper via, wherein a structure of the lower wiring structure corresponds to a structure of the first wiring structure.

According to an exemplary embodiment of the present disclosure, a semiconductor device includes a first substrate, circuit devices disposed on the first substrate, a first wiring structure electrically connected to the circuit devices, a second substrate disposed above the first wiring structure, gate electrodes stacked on the second substrate in a direction perpendicular to an upper surface of the second substrate and spaced apart from each other, a horizontal conductive layer disposed below the gate electrodes on the second substrate, channel structures that extend perpendicular to the second substrate and penetrate the gate electrodes, wherein each channel structure includes an upper via that penetrates the horizontal conductive layer and the second substrate, wherein the upper via is connected to the horizontal conductive layer and the second substrate through a side surface thereof.

According to an exemplary embodiment of the present disclosure, a semiconductor device includes a peripheral circuit region that includes a first substrate, circuit devices disposed on the first substrate, and a first wiring structure electrically connected to the circuit devices, a memory cell region that includes a second substrate disposed above the first substrate, gate electrodes stacked on the second substrate in a direction perpendicular to an upper surface of the second substrate and spaced apart from each other, channel structures that extend perpendicular to the second substrate and penetrate the gate electrodes, wherein each channel structure includes a channel layer, a first horizontal conductive layer and a second horizontal conductive layer that are sequentially stacked on a first region of the second substrate, an insulating region disposed below the second horizontal conductive layer on a second region of the second substrate and that includes a plurality of horizontal sacrificial layers, and a second wiring structure electrically connected to the gate electrodes and the channel structures, and a third wiring structure that connects the first substrate to the second substrate, and that includes an upper via that extends toward the first substrate and penetrates the second horizontal conductive layer, the insulating region, and the second substrate in the second region of the second substrate.

According to an exemplary embodiment of the present disclosure, a semiconductor device includes a first substrate; circuit devices disposed on the first substrate; a first wiring structure that is electrically connected to the circuit devices; a second substrate disposed above the first wiring structure; a first horizontal conductive layer disposed on the second substrate; an insulating region disposed adjacent to the first horizontal conductive layer; a second horizontal conductive layer disposed on the first horizontal conductive layer and the insulating region; gate electrodes and interlayer insulating layers that are alternately stacked on an upper surface of the second horizontal conductive layer; channel structures that extend in a first direction perpendicular to the upper surface of the second horizontal conductive layer and that penetrate the gate electrodes and interlayer insulating layers and extend into the second substrate; a second wiring structure electrically connected to the gate electrodes and the channel structures; and an upper via that extends in the first direction and penetrates the second horizontal conductive layer, the insulating region, and the second substrate, and connects the first substrate to the second substrate.

DETAILED DESCRIPTION

Hereinafter, embodiments of the present disclosure will be described as follows with reference to the accompanying drawings.

Figure 1:
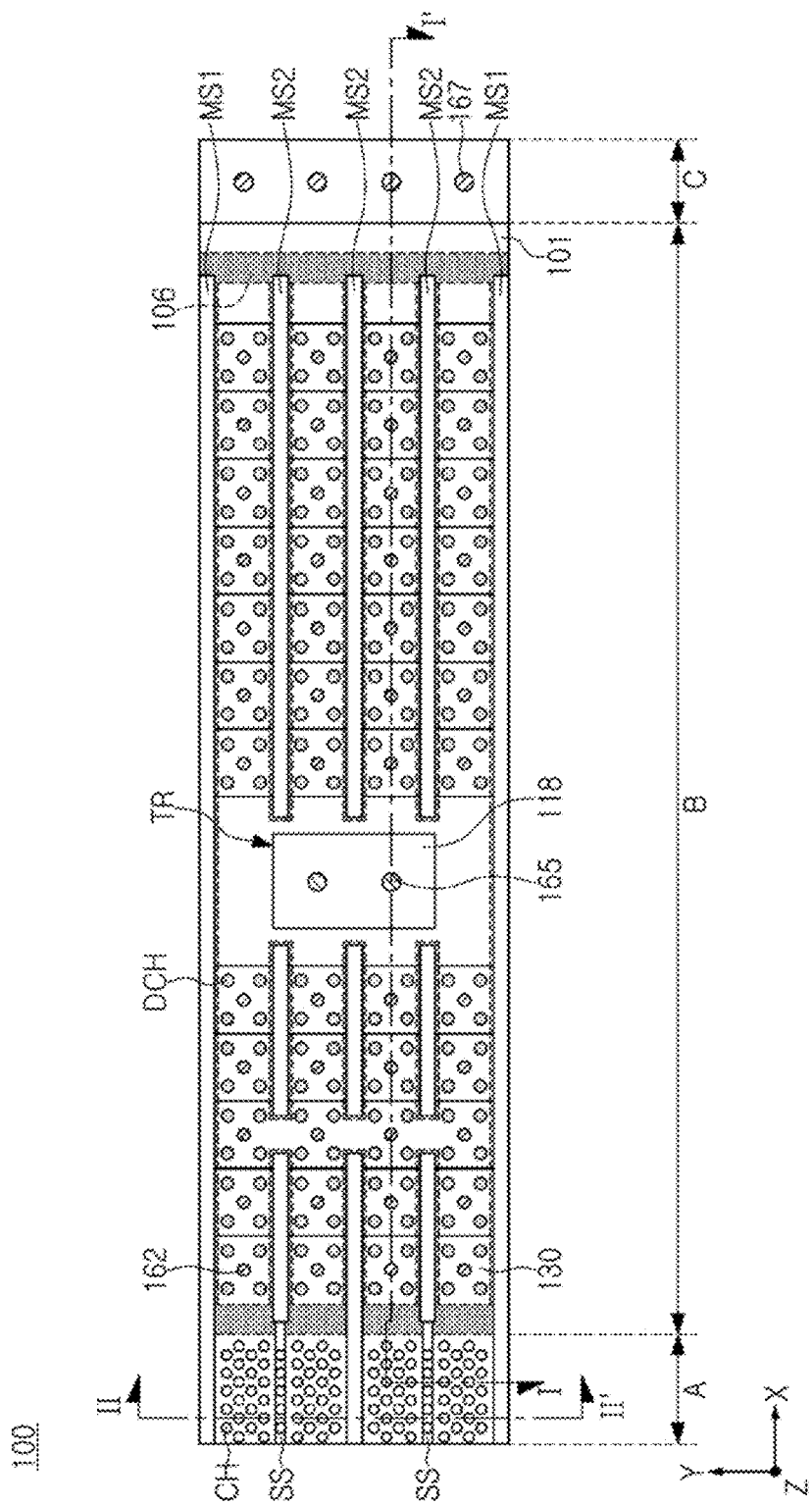
FIG. 1 is a schematic plan view of a semiconductor device according to an exemplary embodiment of the present disclosure.

FIG. 1 is a schematic plan view of a semiconductor device according to an exemplary embodiment.

Figure 2A:
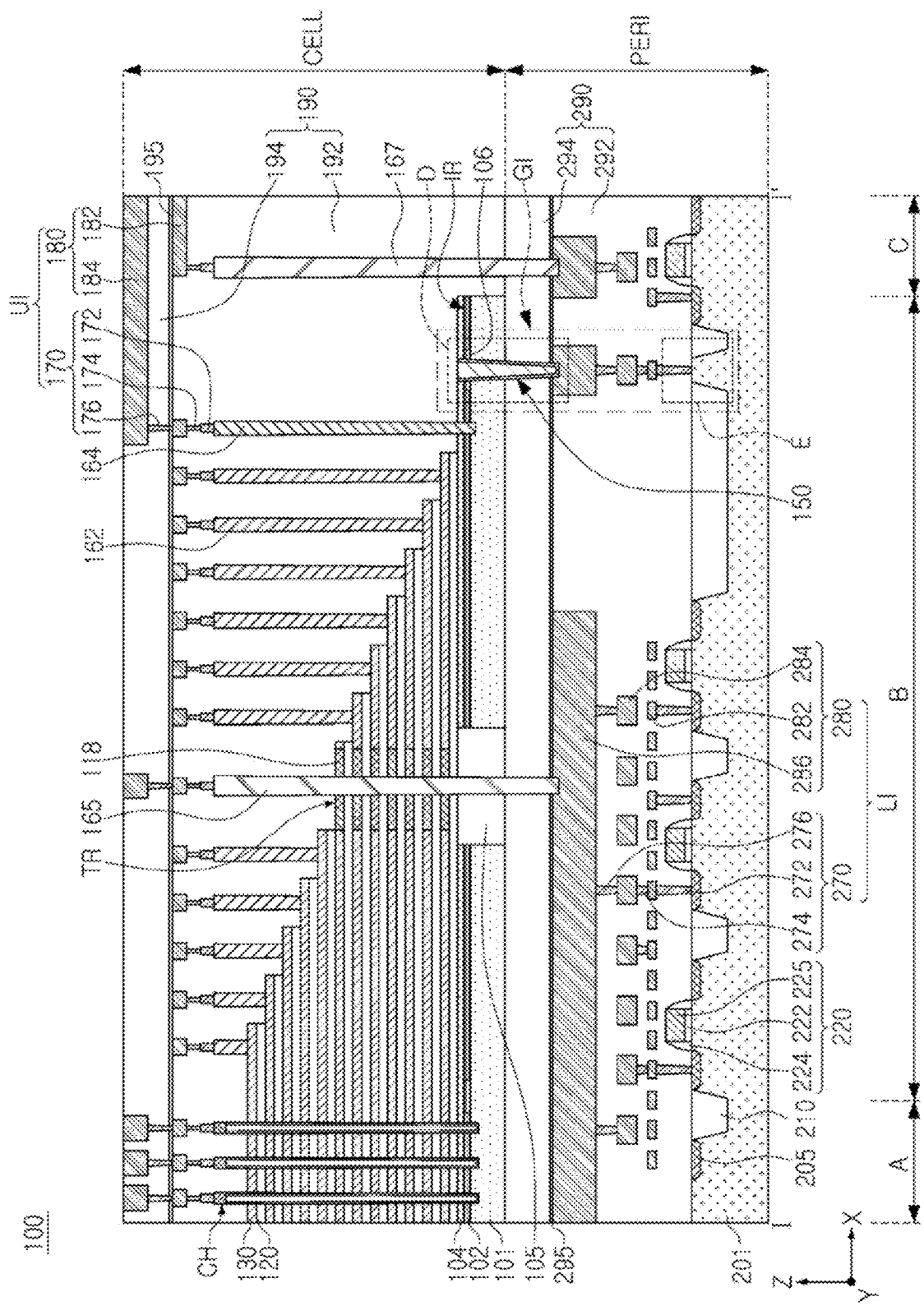
FIGS. 2A and 2B are schematic cross-sectional views of a semiconductor device according to an exemplary embodiment of the present disclosure.
Figure 2B:
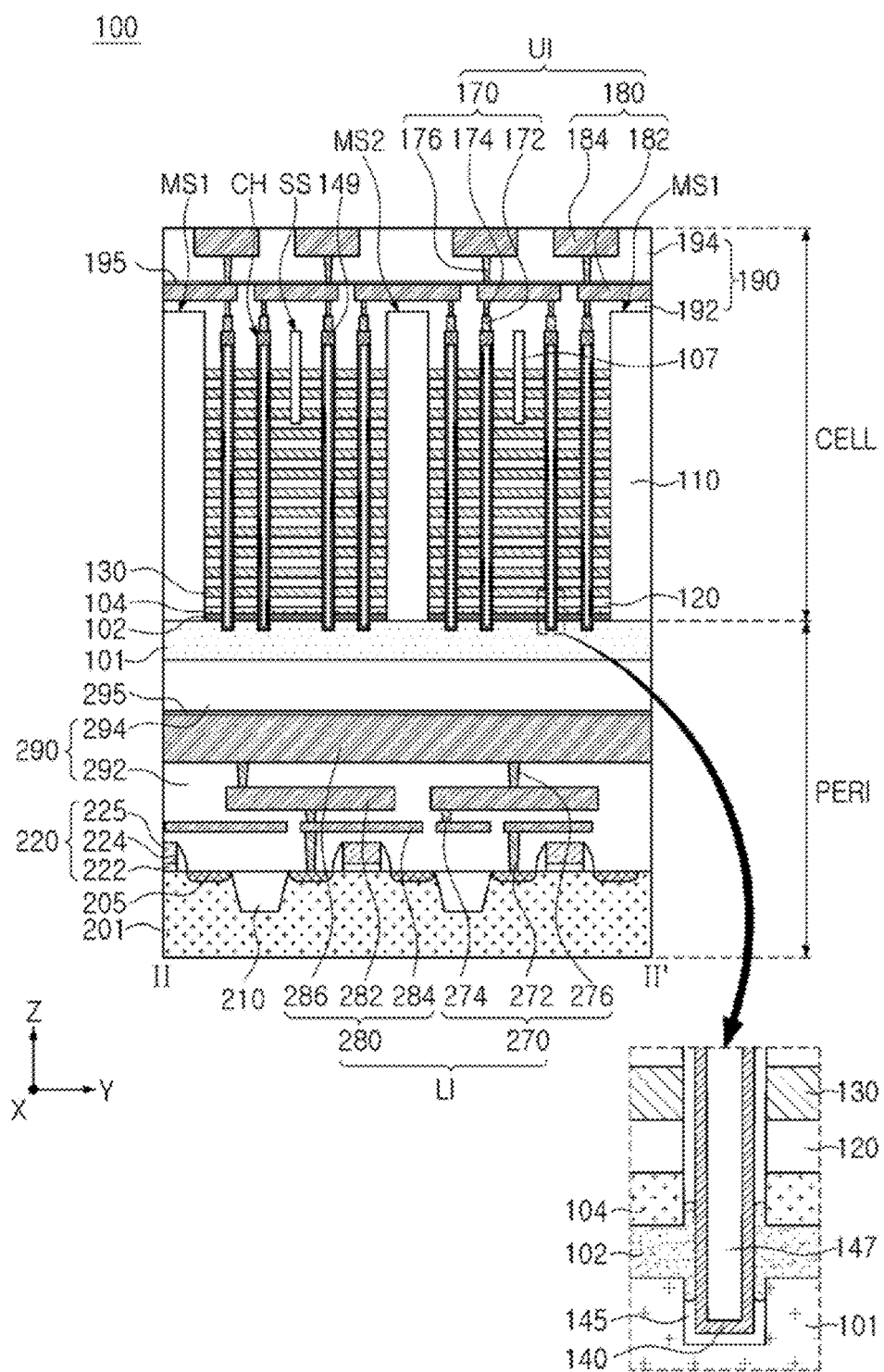

FIGS. 2A and 2B are schematic cross-sectional views of a semiconductor device along lines I-I' and II-II' in FIG. 1 according to an exemplary embodiment.

Figure 3A:
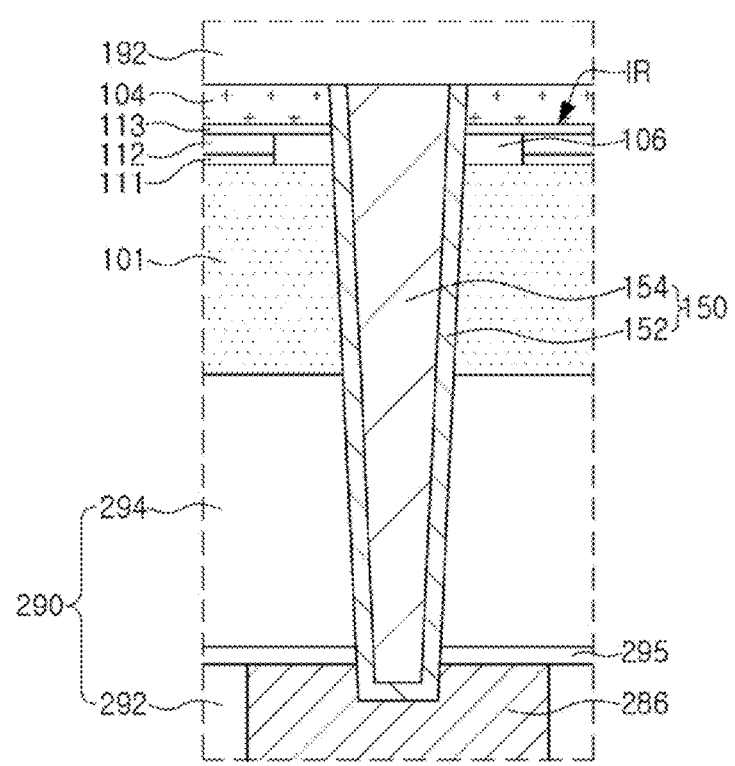
FIGS. 3A and 3B are enlarged views of a portion of a semiconductor device according to an exemplary embodiment of the present disclosure.
Figure 3B:
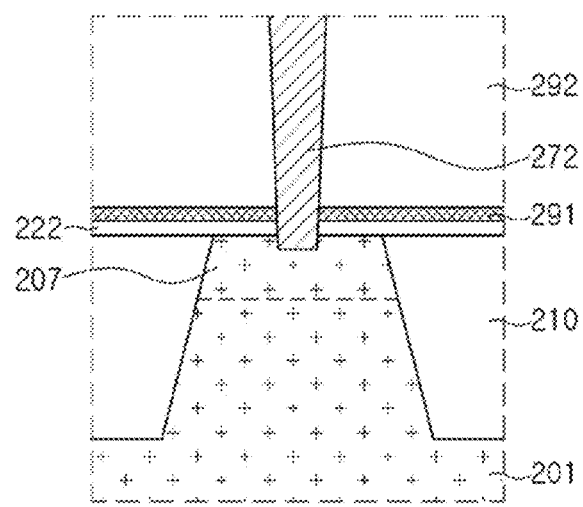

FIGS. 3A and 3B are enlarged views of a portion of a semiconductor device according to an exemplary embodiment, illustrating regions "D" and "E" in FIG. 2A, respectively.

Referring to FIGS. 1 to 3B, according to an embodiment, a semiconductor device 100 includes a peripheral circuit region PERI that includes a first substrate 201, a memory cell region CELL that includes a second substrate 101, a through wiring region TR that includes a first through via 165 that electrically connects the peripheral circuit region PERI to the memory cell region CELL, and a ground wiring structure GI that connects the first substrate 201 to the second substrate 101. The memory cell region CELL is disposed on an upper end of the peripheral circuit region PERI. Alternatively, in exemplary embodiments, the memory cell region CELL is disposed on a lower end of the peripheral circuit region PERI. The through wiring region TR extends from the memory cell region CELL to an upper region of the peripheral circuit region PERI. The ground wiring structure GI extends from a lower region of the memory cell region CELL to the peripheral circuit region PERI.

According to an embodiment, the peripheral circuit region PERI includes the first substrate 201, source/drain regions 205 and device isolation layers 210 disposed in the first substrate 201, circuit devices 220 disposed on the first substrate 201, a peripheral region insulating layer 290, a lower protective layer 295, and a first wiring structure LI.

According to an embodiment, the first substrate 201 has an upper surface that extends in the x direction and the y direction. An active region is defined on the first substrate 201 by the device isolation layers 210. The source/drain regions 205 include impurities and are disposed in a portion of the active region. The first substrate 201 includes a semiconductor, such as a group IV semiconductor, a group III-V compound semiconductor, or a group II-VI compound semiconductor. The first substrate 201 may be provided as a bulk wafer or an epitaxial layer.

According to an embodiment, the circuit devices 220 include planar transistors. Each of the circuit devices 220 includes a circuit gate dielectric layer 222, a spacer layer 224, and a circuit gate electrode 225. The source/drain regions 205 are disposed in the first substrate 201 on both sides of the circuit gate electrode 225.

According to an embodiment, the peripheral region insulating layer 290 is disposed on the circuit device 220 on the first substrate 201. The peripheral region insulating layer 290 includes first and second peripheral region insulating layers 292 and 294, and each of the first and second peripheral region insulating layers 292 and 294 also includes a plurality of insulating layers. The peripheral region insulating layer 290 is formed of an insulating material.

According to an embodiment, lower wiring lines 280 are disposed between the first and second peripheral region insulating layers 292 and 294, and include first to third lower wiring lines 282, 284, and 286. The lower protective layer 295 is disposed on upper surfaces of the third lower wiring lines 286. In exemplary embodiments, the lower protective layer 295 is further disposed on the upper surfaces of the first and second lower wiring lines 282 and 284. The lower protective layer 295 can prevent contamination caused by metal in the lower wiring lines 280. The lower protective layer 295 is formed of an insulating material that differs from a material of the peripheral region insulating layer 290, and may include, for example, silicon nitride.

According to an embodiment, the first wiring structure LI is electrically connected to the circuit devices 220 and the source/drain regions 205. The first wiring structure LI includes lower contact plugs 270, each having a cylindrical shape, and the lower wiring lines 280, each having a linear shape. The lower contact plugs 270 include first to third lower contact plugs 272, 274, and 276. The first lower contact plugs 272 are disposed on the circuit devices 220 and the source/drain regions 205, the second lower contact plugs 274 are disposed on the first lower wiring lines 282, and the third lower contact plugs 276 are disposed on the second lower wiring lines 284. The first lower wiring lines 282 are disposed on the first lower contact plugs 272, the second lower wiring lines 284 are disposed on the second lower contact plugs 274, and the third lower wiring lines 286 are disposed on the third lower contact plugs 276. The first wiring structure LI includes a conductive material, such as tungsten (W), copper (Cu), or aluminum (Al), etc., and each of the components includes a diffusion barrier. In exemplary embodiments, the number of layers and the arrangement form of each of the lower contact plugs 270 and the lower wiring lines 280 included in the first wiring structure LI may vary.

According to an embodiment, the memory cell region CELL includes the second substrate 101, which has a first region A and a second region B, first and second horizontal conductive layers 102 and 104 on the second substrate 101, gate electrodes 130 alternately stacked with interlayer insulating layers 120 on the second substrate 101, first and second separation regions MS1 and MS2 that extend through the stack structure of the gate electrodes 130, upper separation regions SS that partially penetrate through the stack structure, channel structures CH that penetrate the stack structure and extend into the second substrate 101, and a second wiring structure UI that is electrically connected to the gate electrodes 130 and the channel structures CH. A portion of the gate electrodes is replaced with a sacrificial insulating layer 118 in the through wiring region TR. The memory cell region CELL further includes a substrate insulating layer 105, an insulating region IR disposed in the second region B and that includes first to third horizontal sacrificial layers 111, 112, and 113 and a supporting insulating layer 106, gate contacts 162 connected to the gate electrodes 130, a substrate contact 164 connected to the second substrate 101, a cell region insulating layer 190 covering the gate electrodes 130 and interlayer insulating layers 120, and an upper protective layer 195. The memory cell region CELL has a third region C located on an external side of the second substrate 101, and a through wiring structure such as a second through via 167 that connects the memory cell region CELL to the peripheral circuit region PERI is disposed in the third region C.

According to an embodiment, in the first region A of the second substrate 101, the gate electrodes 130 and interlayer insulating layers 120 are vertically stacked, the channel structures CH are disposed, and memory cells are formed. In the second region B, the gate electrodes 130 and interlayer insulating layers 120 extend by different lengths, and electrically connect the memory cells to the peripheral circuit region PERI. The second region B is located on at least one end of the first region A in at least one direction, such as in the x direction.

According to an embodiment, the second substrate 101 has an upper surface that extends in the x direction and the y direction. The second substrate 101 includes a semiconductor, such as a group IV semiconductor, a group III-V compound semiconductor, or a group II-VI compound semiconductor. For example, group IV semiconductors include silicon, germanium, or silicon-germanium. The second substrate 101 further includes impurities. The second substrate 101 may be a polycrystalline semiconductor layer such as a polycrystalline silicon layer, or an epitaxial layer.

According to an embodiment, the first and second horizontal conductive layers 102 and 104 are stacked on the upper surface of the second substrate 101 in the first region A. The first horizontal conductive layer 102 functions as a portion of a common source line of the semiconductor device 100, and may, for example, function as a common source line along with the second substrate 101. As illustrated in the enlarged view in FIG. 2B, the first horizontal conductive layer 102 is directly connected to a channel layer 140 on a circumference of the channel layer 140, described below with reference to FIG. 2B. The first horizontal conductive layer 102 does not extend to the second region B, but the second horizontal conductive layer 104 does extend into the second region B. The second horizontal conductive layer 104 has substantially planar upper and lower surfaces in the first region A and the second region B. Accordingly, in a process of forming the first and second separation regions MS1 and MS2, trenches that form the first and second separation regions MS1 and MS2 have a predetermined depth regardless of the regions.

According to an embodiment, the first and second horizontal conductive layers 102 and 104 include a semiconductor, and may include, for example, polycrystalline silicon. In this case, at least the first horizontal conductive layer 102 is a doped layer, and the second horizontal conductive layer 104 may be a doped layer or a layer that includes impurities that diffused from the first horizontal conductive layer 102. A material of the second horizontal conductive layer 104 is not limited to a semiconductor, and may be replaced with an insulating material.

According to an embodiment, the insulating region IR is positioned between the second substrate 101 and the second horizontal conductive layer 104 in the second region B of the second substrate 101. The insulating region IR has a first region in which the first to third horizontal sacrificial layers 111, 112, and 113 are stacked, and a second region in which the supporting insulating layer 106 and the third horizontal sacrificial layer 113 are stacked.

According to an embodiment, the first to third horizontal sacrificial layers 111, 112, and 113 are disposed on the second substrate 101 and side by side with the first horizontal conductive layer 102, in a portion of the second region B. In the first region of the insulating region IR, the first to third horizontal sacrificial layers 111, 112 and 113 are stacked in order on the second substrate 101. In the second region of the insulating region IR, the third horizontal sacrificial layer 113 covers the supporting insulating layer 106. The first to third horizontal sacrificial layers 111, 112, and 113 remain after being partially replaced with the first horizontal conductive layer 102 in a process of manufacturing the semiconductor device 100. In exemplary embodiments, the arrangement of the region in which the first to third horizontal sacrificial layers 111, 112, and 113 remain in the second region B may vary.

According to an embodiment, the first and third horizontal sacrificial layers 111 and 113 and the second horizontal sacrificial layer 112 include different insulating materials. The first and third horizontal sacrificial layers 111 and 113 include the same material. For example, the first and third horizontal sacrificial layers 111 and 113 are formed of the same material as that of the interlayer insulating layers 120, and the second horizontal sacrificial layer 112 is formed of the same material as that of the sacrificial insulating layers 118, as described below.

According to an embodiment, the supporting insulating layer 106 is disposed on the second substrate 101 in a portion of the second region B. An upper surface of the supporting insulating layer 106 is covered with the third horizontal sacrificial layer 113 and forms the second region of the insulating region IR along with the third horizontal sacrificial layer 113 stacked thereon. The supporting insulating layer 106 covers a side surface of the second horizontal sacrificial layer 112 at an end of the second horizontal sacrificial layer 112, and a side surface of the first horizontal sacrificial layer 111 at an end of the first horizontal sacrificial layer 111. The supporting insulating layer 106 supports the second horizontal conductive layer 104 disposed thereon in a process of manufacturing the semiconductor device 100. In addition, the supporting insulating layer 106 prevents an etchant that removes the first and second horizontal sacrificial layers 111, 112 from damaging the second horizontal conductive layer 104 in a process of manufacturing the semiconductor device 100. This configuration will be described in greater detail with reference to FIG. 10I.

As illustrated in FIG. 1, according to an embodiment, the supporting insulating layer 106 surrounds the first and second separation regions MS1 and MS2, and extends in the y direction in edge regions of the second region B. The edge regions include a boundary region between the first region A and the second region B. In exemplary embodiments, a dispositional region and a shape of the supporting insulating layer 106 may vary. The supporting insulating layer 106 is formed of an insulating material, and may include, for example, silicon oxide, silicon oxynitride, or silicon nitride. In exemplary embodiments, the supporting insulating layer 106 is formed of the same material as that of the third horizontal sacrificial layer 113. In this case, an interface between the supporting insulating layer 106 and the third horizontal sacrificial layer 113 is not distinct.

According to an embodiment, the substrate insulating layer 105 is disposed in a region from which the second substrate 101, the first to third horizontal sacrificial layers 111, 112, and 113, and the second horizontal conductive layer 104 are partially removed such that the substrate insulating layer 105 is surrounded by the second substrate 101, the first to third horizontal sacrificial layers 111, 112, and 113, and the second horizontal conductive layer 104. A lower surface of the substrate insulating layer 105 may be coplanar with a lower surface of the second substrate 101 or may be located at a level lower than that of the lower surface of the second substrate 101. In exemplary embodiments, the substrate insulating layer 105 includes a plurality of layers stacked on the second peripheral region insulating layer 294. The substrate insulating layer 105 is formed of an insulating material, and may include, for example, silicon oxide, silicon oxynitride, or silicon nitride.

According to an embodiment, the gate electrodes 130 are vertically stacked on the second substrate 101, are spaced apart from each other, and form a stack structure with the interlayer insulating layers 120. The gate electrodes 130 forma ground select transistor, memory cells, and a string select transistor in order from the second substrate 101. The number of the gate electrodes 130 included in the memory cells is determined by a desired capacity of the semiconductor device 100. In exemplary embodiments, one or two gate electrodes 130 form each of the string select transistor and the ground select transistor, and have a structure that may be the same as or different from a structure of the gate electrodes 130 that form the memory cells. In addition, there are gate electrodes 130 disposed above the gate electrode 130 that forms the string select transistor and below the gate electrode 130 that form the ground select transistor that form an erase transistor used for an erasing operation that uses a gate induced drain leakage (GIDL) phenomenon. Furthermore, a portion of the gate electrodes 130, such as the gate electrodes 130 adjacent to the gate electrode 130 that forms the string select transistor or the gate electrodes 130 adjacent to the gate electrode 130 that forms the ground select transistor, may be dummy gate electrodes.

According to an embodiment, the gate electrodes 130 are vertically stacked on the first region A, are spaced apart from each other, extend by different lengths from the first region A into the second region B, and form stepped portions that have a staircase shape. As illustrated in FIG. 2A, the stepped portions are formed between the gate electrodes 130 in the x direction. In exemplary embodiments, at least a portion of the gate electrodes 130, such as two to six gate electrodes 130, form a single gate group and form stepped portions between the gate groups in the x direction. In this case, the gate electrodes 130 that form a single gate group have stepped portions in the y direction as well. Due to the stepped portions, the gate electrodes 130 have a staircase shape in which lower gate electrodes 130 extends longer than upper gate electrodes 130, and the ends thereof are exposed by the interlayer insulating layers 120. In exemplary embodiments, the ends of the gate electrodes 130 have an increased thickness.

According to an embodiment, the gate electrodes 130 include a metal, such as tungsten (W). In exemplary embodiments, the gate electrodes 130 may include polycrystalline silicon or a metal silicide. In exemplary embodiments, the gate electrodes 130 may further include a diffusion barrier, and the diffusion barrier may include, for example, tungsten nitride (WN), tantalum nitride (TaN), titanium nitride (TiN), or a combination thereof.

According to an embodiment, the interlayer insulating layers 120 are disposed between the gate electrodes 130. Similar to the gate electrodes 130, the interlayer insulating layers 120 are spaced apart from each other in a direction perpendicular to the upper surface of the second substrate 101 and extend in the x direction. The interlayer insulating layers 120 include an insulating material such as silicon oxide or silicon nitride.

According to an embodiment, the first and second separation regions MS1 and MS2 penetrate the gate electrodes 130 and extend in the x direction in the first region A and the second region B. As illustrated in FIG. 1, the first and second separation regions MS1 and MS2 extend parallel to each other. The first and second separation regions MS1 and MS2 penetrate the entire gate electrodes 130/interlayer insulating layers 120 stack that is disposed on the second substrate 101 and connect with the second substrate 101, as illustrated in FIG. 2B. The first separation regions MS1 extends continuously through the first region A and the second region B, and the second separation regions MS2 are disconnected in the second region B, or are intermittently disposed in the first region A and the second region B. In exemplary embodiments, the arrangement order of the first and second separation regions MS1 and MS2 and the arrangement gap therebetween may vary.

According to an embodiment, in the first and second separation regions MS1 and MS2, a separation insulating layer 110 is disposed as illustrated in FIG. 28. In exemplary embodiments, a width of the separation insulating layer 110 decreases toward the second substrate 101 due to a high aspect ratio. In exemplary embodiments, a conductive layer is further disposed between the separation insulating layers 110 in the first and second separation regions MS1 and MS2. In this case, the conductive layer may function as a common source line of the semiconductor device 100 or as a contact plug connected to the common source line.

According to an embodiment, the upper separation regions SS extend in the x direction between the first separation regions MS1 and the second separation region MS2. The upper separation regions SS are disposed in a portion of the second region B and in the first region A and penetrate the uppermost gate electrodes 130. As illustrated in FIG. 2B, the upper separation regions SS isolate three uppermost gate electrodes 130 from one another in the y direction. The number of gate electrodes 130 isolated by the upper separation regions SS may vary in exemplary embodiments. The upper separation regions SS include an upper separation insulating layer 107.

According to an embodiment, each of the channel structures CH forms a single memory cell string, and are spaced apart from each other while forming rows and columns on the first region A. The channel structures CH may form a grid pattern or a zigzag shape in one direction in the x-y plane. Each of the channel structures CH has a columnar shape, and has an inclined side surface of which a width decreases towards the second substrate 101, depending on an aspect ratio. In exemplary embodiments, the channel structures CH disposed at ends of the first region A adjacent to the second region B may be dummy channels which do not substantially form a memory cell string.

As illustrated in the enlarged view in FIG. 2B, according to an embodiment, the channel layer 140 is disposed in each channel structure CH. The channel layer 140 in the channel structure CH has an annular shape that surrounds a channel filling insulating layer 147, but in exemplary embodiments, the channel layer 140 may have a columnar shape such as a cylindrical shape or a prism shape without the channel filling insulating layer 147. A lower portion of the channel layer 140 is connected to the first horizontal conductive layer 102. The channel layer 140 includes a semiconductor material such as polycrystalline silicon or single crystalline silicon. The channel structures CH extend linearly in the y direction between the first or second separation regions MS1 and MS2 and the upper separation region SS and are electrically separated from each other by the second wiring structures UI, which are connected to channel pads 149.

According to an embodiment, the channel pads 149 are disposed on the channel layer 140 in the channel structures CH. The channel pads 149 cover an upper surface of the channel filling insulating layer 147 and are electrically connected to the channel layer 140. The channel pads 149 include, for example, doped polycrystalline silicon.

According to an embodiment, a gate dielectric layer 145 is disposed between the gate electrodes 130 and interlayer insulating layers 120 and the channel layer 140, and between the channel layer 140 and the second substrate 101. The gate dielectric layer 145 includes a tunneling layer, a charge storage layer, and a blocking layer, stacked in order from the channel layer 140. The tunneling layer tunnels an electric charge to the charge storage layer, and may include, for example, silicon oxide ($SiO_2$), silicon nitride ($Si_3N_4$), silicon oxynitride (SiON), or a combination thereof. The charge storage layer may be a charge trapping layer or a floating gate conductive layer. The blocking layer may include silicon oxide ($SiO_2$), silicon nitride ($Si_3N_4$), silicon oxynitride (SiON), a high-k dielectric material, or a combination thereof. In exemplary embodiments, at least a portion of the gate dielectric layer 145 extends in a horizontal direction along the gate electrodes 130.

According to an embodiment, the cell region insulating layer 190 covers the second substrate 101, the gate electrodes 130 on the second substrate 101, and the peripheral region insulating layer 290. The cell region insulating layer 190 includes first and second cell region insulating layers 192 and 194, and each of the first and second cell region insulating layers 192 and 194 includes a plurality of insulating layers. The cell region insulating layer 190 is formed of an insulating material.

According to an embodiment, the upper protective layer 195 is disposed on upper surfaces of the first upper wiring lines 182 between the first and second cell region insulating layers 192 and 194. In exemplary embodiments, the upper protective layer 195 is further disposed on the upper surfaces of the second upper wiring lines 184. The upper protective layer 195 can prevent contamination caused by a metals of the upper wiring lines 180 that are disposed below the upper protective layer 195. The upper protective layer 195 is formed of an insulating material that differs from that of the cell region insulating layer 190, and includes, for example, silicon nitride.

According to an embodiment, the gate contacts 162 are connected to the gate electrodes 130 in the second region B. The gate contacts 162 penetrate at least a portion of the first cell region insulating layer 192 and are connected to the exposed upper portions of the gate electrodes 130. The substrate contact 164 is connected to the second substrate 101 at an end of the second region B. The substrate contact 164 penetrates at least a portion of the first cell region insulating layer 192 and the exposed upper portion of the second horizontal conductive layer 104, and the first to third horizontal sacrificial layers 111, 112, and 113 disposed below the second horizontal conductive layer 104, and connects to the second substrate 101. For example, the substrate contact 164 transmits an electrical signal to a common source line included in the second substrate 101.

According to an embodiment, the second wiring structure UI is electrically connected to the gate electrodes 130 and the channel structures CH. The second wiring structure UI includes upper contact plugs 170, each having a cylindrical shape, and upper wiring lines 180, each having a linear shape. The upper contact plugs 170 include first to third upper contact plugs 172, 174, and 176. The first upper contact plugs 172 are disposed on the channel pads 149, the gate contacts 162, and the substrate contact 164, the second upper contact plugs 174 are disposed on the first upper contact plugs 172, and the third upper contact plugs 176 are disposed on the first upper wiring lines 182. The upper wiring lines 180 include first and second upper wiring lines 182 and 184. The first upper wiring lines 182 are disposed on the second upper contact plugs 174, and the second upper wiring lines 184 are disposed on the third upper contact plugs 176. The second wiring structure UI includes a conductive material, such as tungsten (W), copper (Cu), or aluminum (Al), etc., and further includes a diffusion barrier. In exemplary embodiments, the number of layers and the arrangement of each of the upper contact plugs 170 and the upper wiring lines 180 in the second wiring structure UI may vary.

According to an embodiment, the through wiring region TR includes a through wiring structure that electrically connects the memory cell region CELL to the peripheral circuit region PERI. The through wiring region TR includes a first through via 165 that penetrates the second substrate 101 from an upper portion of the memory cell region CELL and extends in the z direction, and a through insulating region that surrounds the first through via 165. The through insulating region includes the sacrificial insulating layers 118, the interlayer insulating layers 120 alternately disposed with the sacrificial insulating layers 118, and the substrate insulating layer 105. In exemplary embodiments, a size, arrangement, and a shape of the through wiring region TR may vary. In FIG. 2A, the through wiring region TR is disposed in the second region B, but embodiments are not limited thereto, and the through wiring region TR may also be disposed in the first region A with a predetermined interval. The through wiring region TR is spaced apart from the first and second separation regions MS1 and MS2. For example, the through wiring region TR is disposed between a pair of first separation regions MS1 that are adjacent in the y direction. By disposing the through wiring region TR as above, the sacrificial insulating layers 118 remain in the through wiring region TR.

According to an embodiment, the first through via 165 penetrates a portion of the first cell region insulating layer 192, the through insulating region, the second peripheral region insulating layer 294, and the lower protective layer 295 from an upper portion and extend perpendicular to the upper surface of the second substrate 101. An upper end of the first through via 165 is connected to the second wiring structure UI, and a lower end is connected to the first wiring structure LI. In exemplary embodiments, a number, arrangement, and shape of the first through vias 165 in a single through wiring region TR may vary. The first through via 165 includes a conductive material, such as a metal such as tungsten (W), copper (Cu), or aluminum (Al).

According to an embodiment, the sacrificial insulating layers 118 are disposed on a same level as that of the gate electrodes 130 and have a thickness equal to that of the gate electrodes 130, and side surfaces of the sacrificial insulating layers 118 are in contact with side surfaces of the gate electrodes 130 at a boundary of the through wiring region TR. The sacrificial insulating layers 118 are alternately stacked with the interlayer insulating layers 120 and form the through insulating region. A width of the sacrificial insulating layers 118 may be the same as or different from that of the lower substrate insulating layer 105 disposed below the sacrificial insulating layers 118. The sacrificial insulating layers 118 are formed of an insulating material that differs from that of the interlayer insulating layers 120, and may include, for example, silicon oxide, silicon nitride, or silicon oxynitride.

According to an embodiment, the second through via 167 is disposed in the third region C of the memory cell region CELL, away from the second substrate 101, and extends into the peripheral circuit region PERI. The second through via 167 connects the second wiring structure UI to the first wiring structure LI, similar to the first through via 165 of the through wiring region TR. The second through via 167 extends from an upper portion through the first cell region insulating layer 192 and the second peripheral region insulating layer 294. The second through via 167 includes a conductive material, and such as a metal such as tungsten (W), copper (Cu), or aluminum (Al).

According to an embodiment, the ground wiring structure GI is disposed across the peripheral circuit region PERI and the memory cell region CELL and connects the first substrate 201 to the second substrate 101. The ground wiring structure GI grounds the second substrate 101 and the second horizontal conductive layer 104 when the semiconductor device 100 is manufactured. The ground wiring structure GI includes lower contact plugs 270 and lower wiring lines 280, which are a part of the first wiring structure LI, and further includes an upper via 150 connected to the uppermost third lower wiring line 286 of the lower wiring lines 280. The ground wiring structure GI may be referred to as a third wiring structure, distinguished from the first and second wiring structures LI and UI, or may be referred to as a second wiring structure, distinguished from the first wiring structure.

Although FIG. 2A illustrates only a portion, according to an embodiment, a plurality of the ground wiring structures GI are disposed in the semiconductor device 100, spaced apart from each other with a predetermined interval d. The ground wiring structures GI are disposed in the second region B of the second substrate 101 and outside the second region B. In addition, the ground wiring structures GI are disposed externally to ends of the gate electrodes 130 in the x direction, but embodiments are not limited thereto. The ground wiring structure GI is spaced apart from the circuit devices 220 of the peripheral circuit region PERI.

According to an embodiment, the upper via 150 penetrates from an upper portion the second horizontal conductive layer 104, the insulating region IR, the second substrate 101, the second peripheral region insulating layer 294, and the lower protective layer 295 and directly connects to the third lower wiring line 286. In an exemplary embodiment, the upper via 150 penetrates the supporting insulating layer 106 and the third horizontal sacrificial layer 113, the second region of the insulating region IR. Alternatively, in exemplary embodiments, the upper via 150 penetrates the first to third horizontal sacrificial layers 111, 112, and 113 in the first region of the insulating region IR. As the upper via 150 is formed after the second horizontal conductive layer 104 is formed, an upper surface of the upper via 150 is formed at the same level as an upper surface of the second horizontal conductive layer 104, and is coplanar with the upper surface of the second horizontal conductive layer 104.

As illustrated in FIG. 3A, according to an embodiment, the upper via 150 include a barrier layer 152 that covers a side surface and a bottom surface of the via hole, and a via conductive layer 154 that fills the via hole. The upper via 150 is connected to the second horizontal conductive layer 104 and the second substrate 101 through a side surface, that is, an external surface of the barrier layer 152. The barrier layer 152 and the via conductive layer 154 are in contact with the first cell region insulating layer 192 at an upper surface of the upper via 150. The barrier layer 152 includes a metal nitride, such as titanium nitride (TiN), titanium silicon nitride (TiSiN), tungsten nitride (WN), or tantalum nitride (TaN), or a combination thereof. The via conductive layer 154 includes a conductive material, such as tungsten (W), copper (Cu), or aluminum (Al), etc.

According to an embodiment, a diameter of an upper portion of the upper via 150 is greater than a diameter of a lower portion, and the diameters of the upper portion and the lower portion range from, for example, about 200 nm to about 300 nm. The upper via 150 is recessed into the third lower wiring line 286 to a predetermined depth. For example, the depth ranges from about 30 Å to about 90 Å.

According to an embodiment, the lower wiring structure in the ground wiring structure GI includes components similar to those of the first wiring structure LI, but is electrically isolated from the first wiring structure LI. The lower wiring structure includes first to third lower contact plugs 272, 274, and 276 and first to third lower wiring lines 282, 284, and 286, spaced apart from the first wiring structure LI.

As illustrated in FIG. 3B, according to an embodiment, in the lower wiring structure, the lowermost first lower contact plug 272 penetrates a portion of the first peripheral region insulating layer 292, an etch stop layer 291, and a circuit gate dielectric layer 222, and connects to an impurity region 207 formed in the first substrate 201. The circuit gate dielectric layer 222 extends from the circuit devices 220, and the etch stop layer 291 is formed on the circuit gate dielectric layer 222 and performs an etching stopping function when the first lower contact plugs 272 are formed. The impurity region 207 is a doped layer formed in a region connected to the first lower contact plugs 272 and that electrically connects the first lower contact plugs 272 to the first substrate 201. In the lower wiring structure, the first lower contact plugs 272 are connected to the impurity regions 207 in a region surrounded by the device isolation layers 210.

Figure 4A:
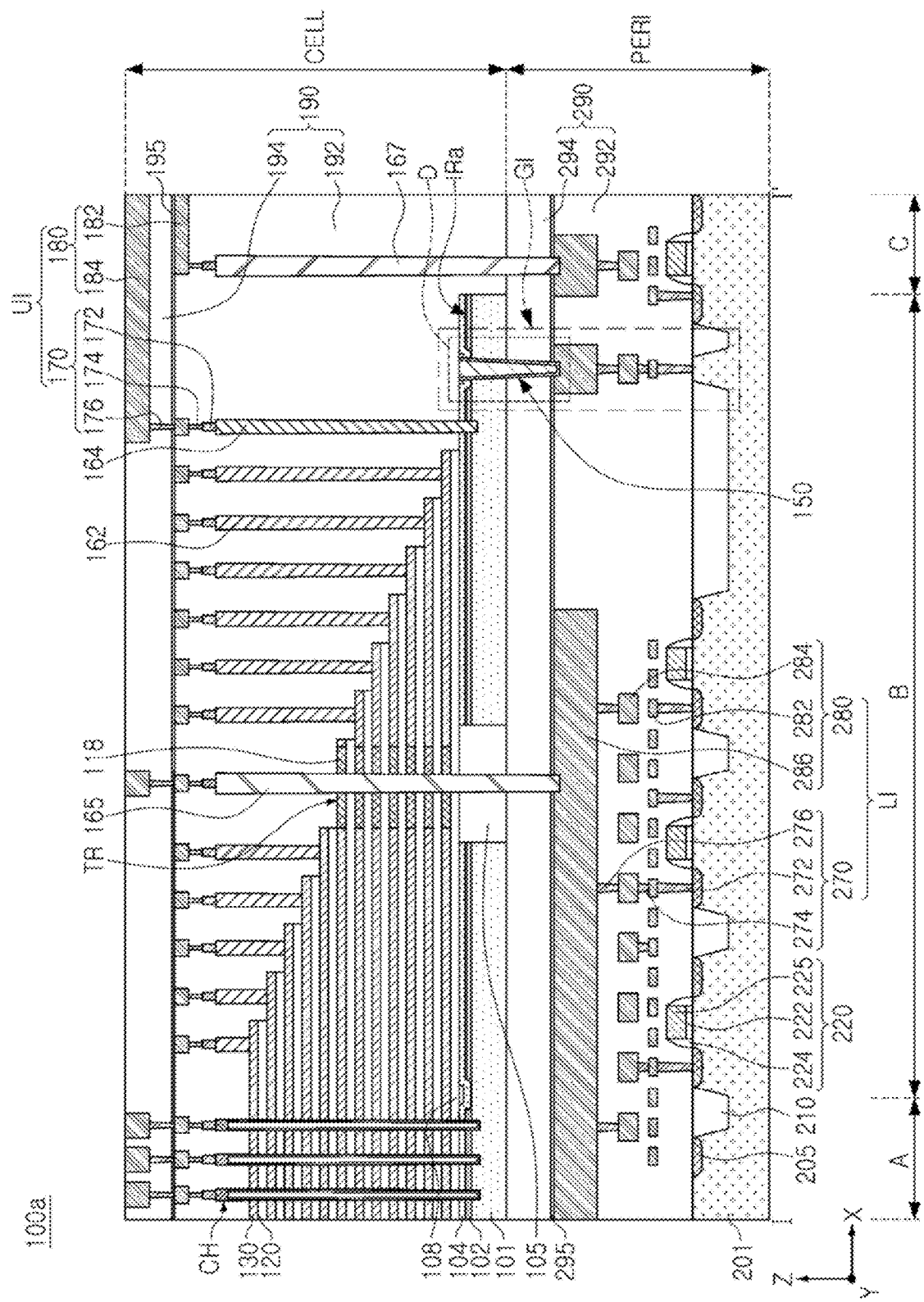
FIGS. 4A and 4B are a schematic cross-sectional view of a semiconductor device and an enlarged view of a portion of a semiconductor device according to an exemplary embodiment of the present disclosure.
Figure 4B:
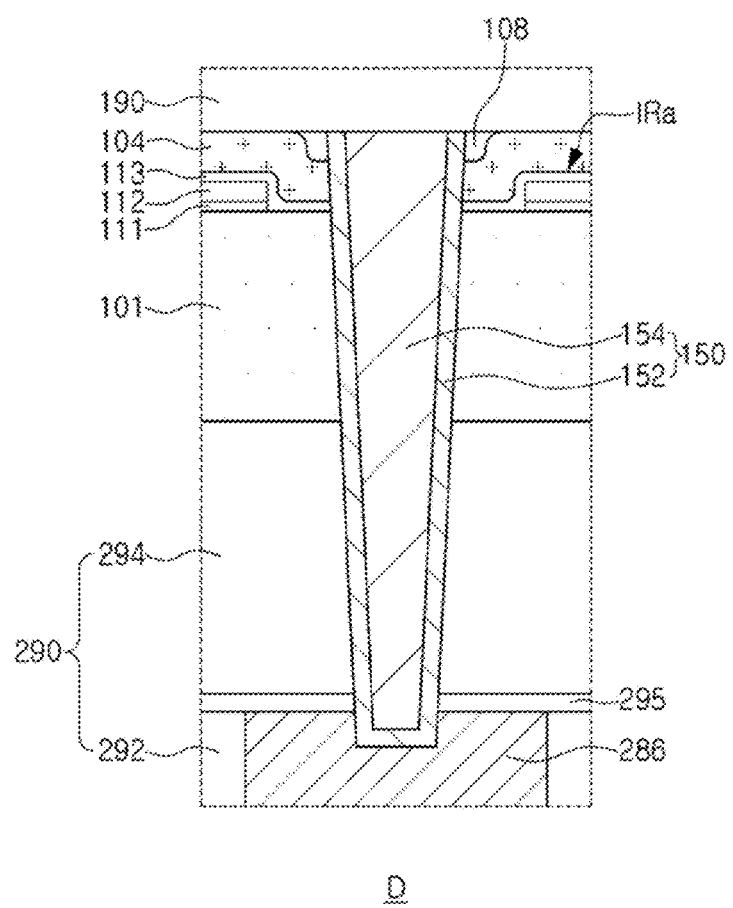

FIGS. 4A and 4B are, respectively, a schematic cross-sectional view of a semiconductor device and a view of a portion of a semiconductor device according to an exemplary embodiment. FIG. 4B is an enlarged view of region "D" in FIG. 4A in enlarged form.

Referring to FIGS. 4A and 4B, according to an embodiment, in a semiconductor device 100a, a memory cell region CELL further includes a planarization insulating layer 108 disposed on a portion of a second horizontal conductive layer 104. An insulating region IRa of the memory cell region CELL has a first region in which first to third horizontal sacrificial layers 111, 112, and 113 are stacked, and a second region in which the third horizontal sacrificial layer 113 extends onto a second substrate 101 and contacts the second substrate 101.

According to an embodiment, the third horizontal sacrificial layer 113 covers a side surface of the second horizontal sacrificial layer 112 at an end of the second horizontal sacrificial layer 112 and extends onto the second substrate 101. Each of the third horizontal sacrificial layer 113 and the second horizontal conductive layer 104 has an upper surface that includes a bent portion formed by height level differences between the first and second horizontal sacrificial layers 111 and 112 and the second substrate 101 at a boundary between the first region and the second region of the insulating region IR. The planarization insulating layer 108 is disposed on the second horizontal conductive layer 104 and fills the bent region, and has an upper surface substantially coplanar with an uppermost surface of the second horizontal conductive layer 104. The planarization insulating layer 108 is formed of an insulating material, and may include, for example, silicon oxide, silicon oxynitride, or silicon nitride.

According to an embodiment, in the ground wiring structure GI, an upper via 150 penetrates the planarization insulating layer 108, the second horizontal conductive layer 104, the third horizontal sacrificial layer 113, each disposed in the insulating region IRa, and the second substrate 101, and extends into the peripheral circuit region PERI. An upper surface of the upper via 150 is located at substantially the same level as a level of the uppermost surface of the second horizontal conductive layer 104 and the upper surface of the planarization insulating layer 108.

Figure 5A:
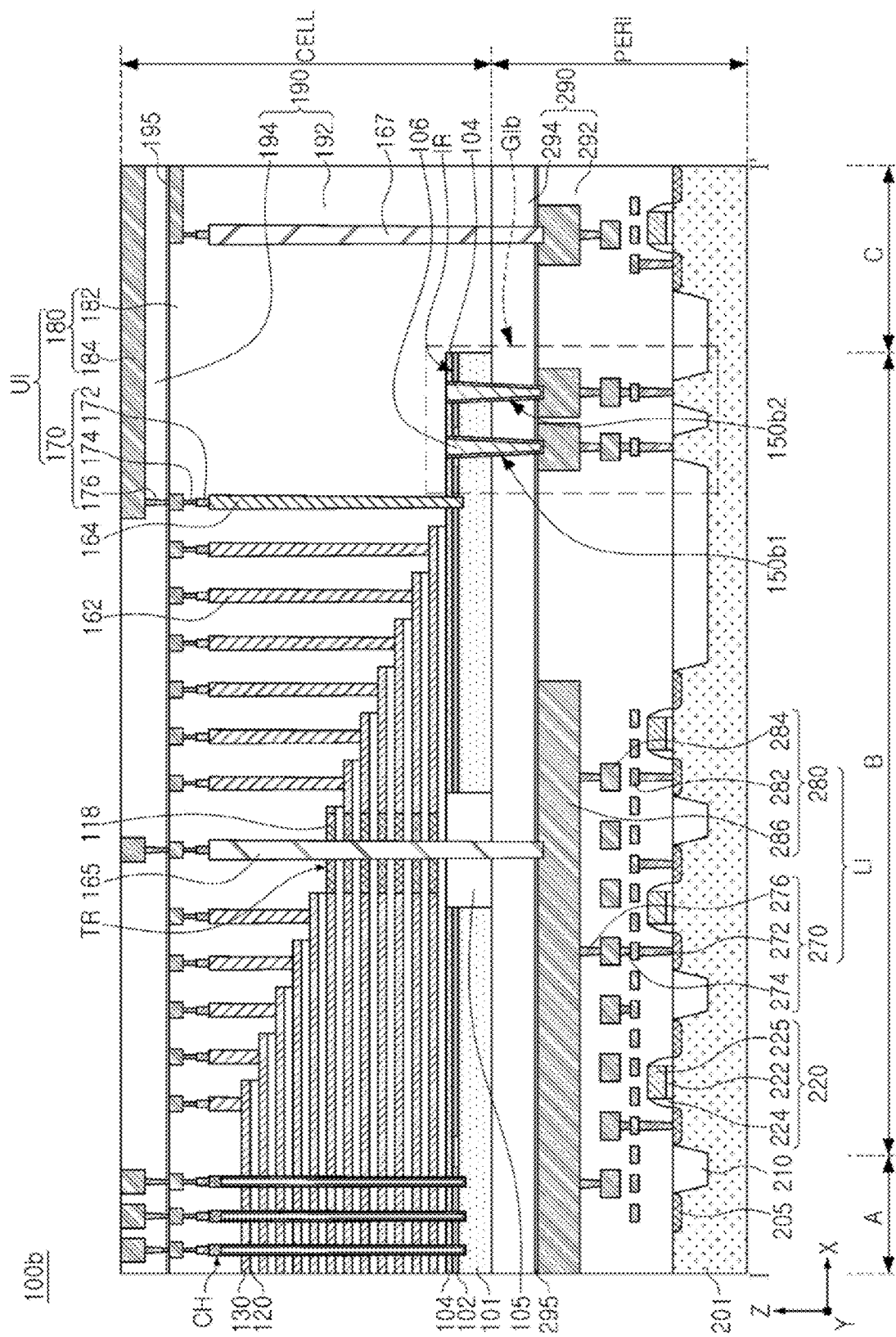
FIGS. 5A and 5B are schematic cross-sectional views of a semiconductor device according to an exemplary embodiment of the present disclosure.
Figure 5B:
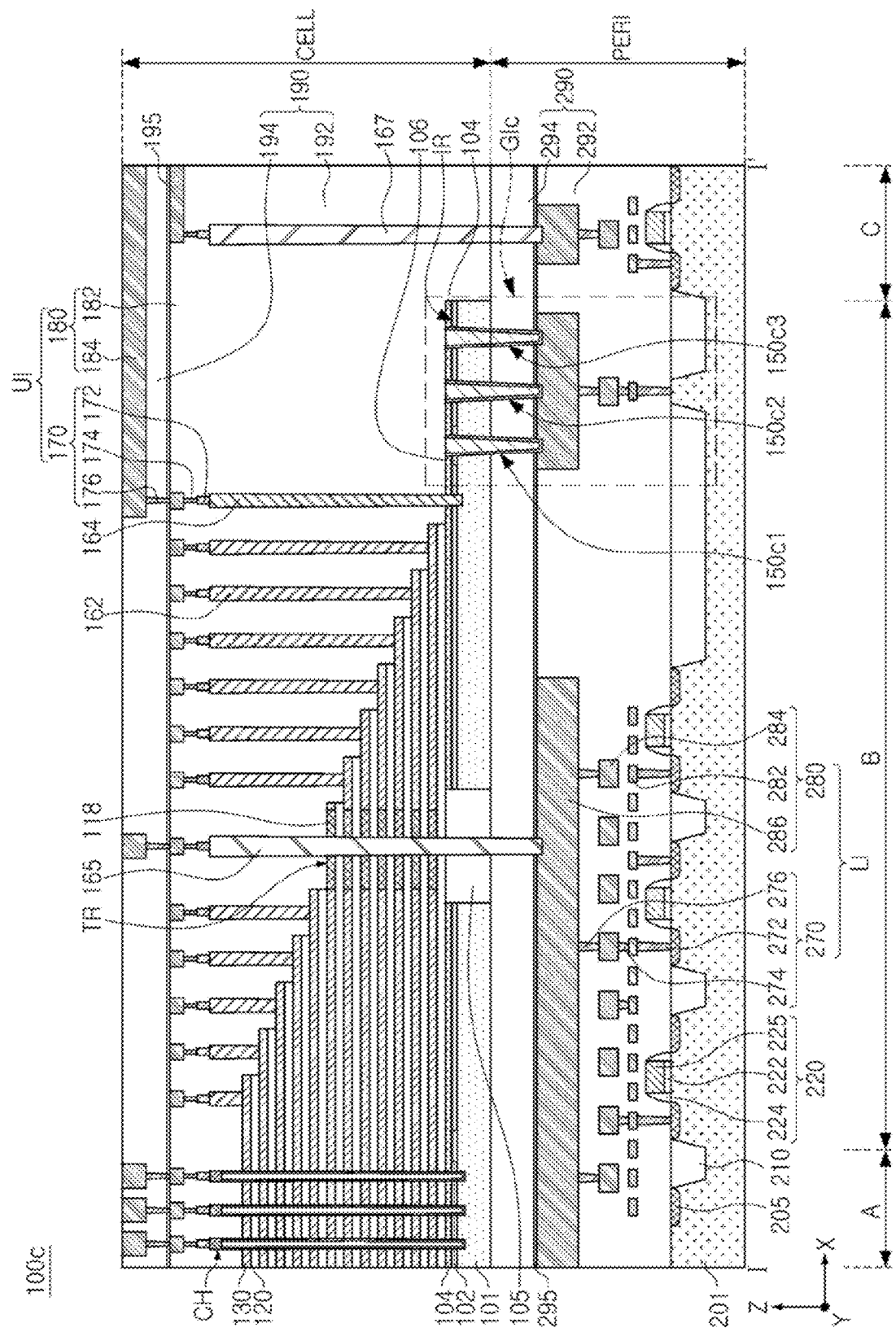

FIGS. 5A and 5B are schematic cross-sectional views of a semiconductor device according to an exemplary embodiment.

Referring to FIG. 5A, according to an embodiment, a ground wiring structure GIb of a semiconductor device 100b includes two upper vias, first and second upper vias 150b1 and 150b2, that penetrate a first region and a second region of an insulating region IR, respectively, and include a plurality of lower wiring structures disposed below the first and second upper vias 150b1 and 150b2, respectively.

According to an embodiment, the first upper via 150b1 penetrates the second region of the insulating region IR in which a supporting insulating layer 106 and a third horizontal sacrificial layer 113 are stacked, as in an exemplary embodiment in FIG. 2A. The second upper via 150b2 is disposed side by side with the first upper via 150b1, and penetrates the first region of the insulating region IR in which the first to third horizontal sacrificial layers 111, 112, and 113 are stacked. In exemplary embodiments, similar to the second upper via 150b2, upper vias may penetrate the first region of the insulating region IR rather than the second region or simultaneously penetrate the first region and the second region. In addition, the penetration form of the upper via is also incorporated into other exemplary embodiments.

According to an embodiment, the plurality of lower wiring structures are isolated from each other are connected to the first and second upper vias 150b1 and 150b2, respectively, as illustrated in FIG. 5A.

Referring to FIG. 5B, according to an embodiment, a ground wiring structure GIc of a semiconductor device 100c includes three upper vias, i.e., first to third upper vias 150c1, 150c2, and 150c3, and lower wiring structures disposed below the first to third upper vias 150c1, 150c2, and 150c3.

According to an embodiment, the first upper via 150c1 penetrates the second region of the insulating region IR in which the supporting insulating layer 106 and the third horizontal sacrificial layer 113 are stacked. The second and third upper vias 150c2 and 150c3 are disposed side by side with the first upper via 150b1, and penetrate the first region of the insulating region IR in which the first to third horizontal sacrificial layers 111, 112, and 113 are stacked.

Different from an exemplary embodiment in FIG. 5A, the lower wiring structure has a single lower wiring structure in which the third lower wiring lines 286 is connected in common to the first to third upper vias 150c1, 150c2, and 150c3.

As in exemplary embodiments of FIGS. 5A and 5B, a plurality of upper vias may be disposed, and the arrangement form of the lower wiring structures connected to the plurality of upper vias and the penetration form of the upper via may vary.

Figure 6A:
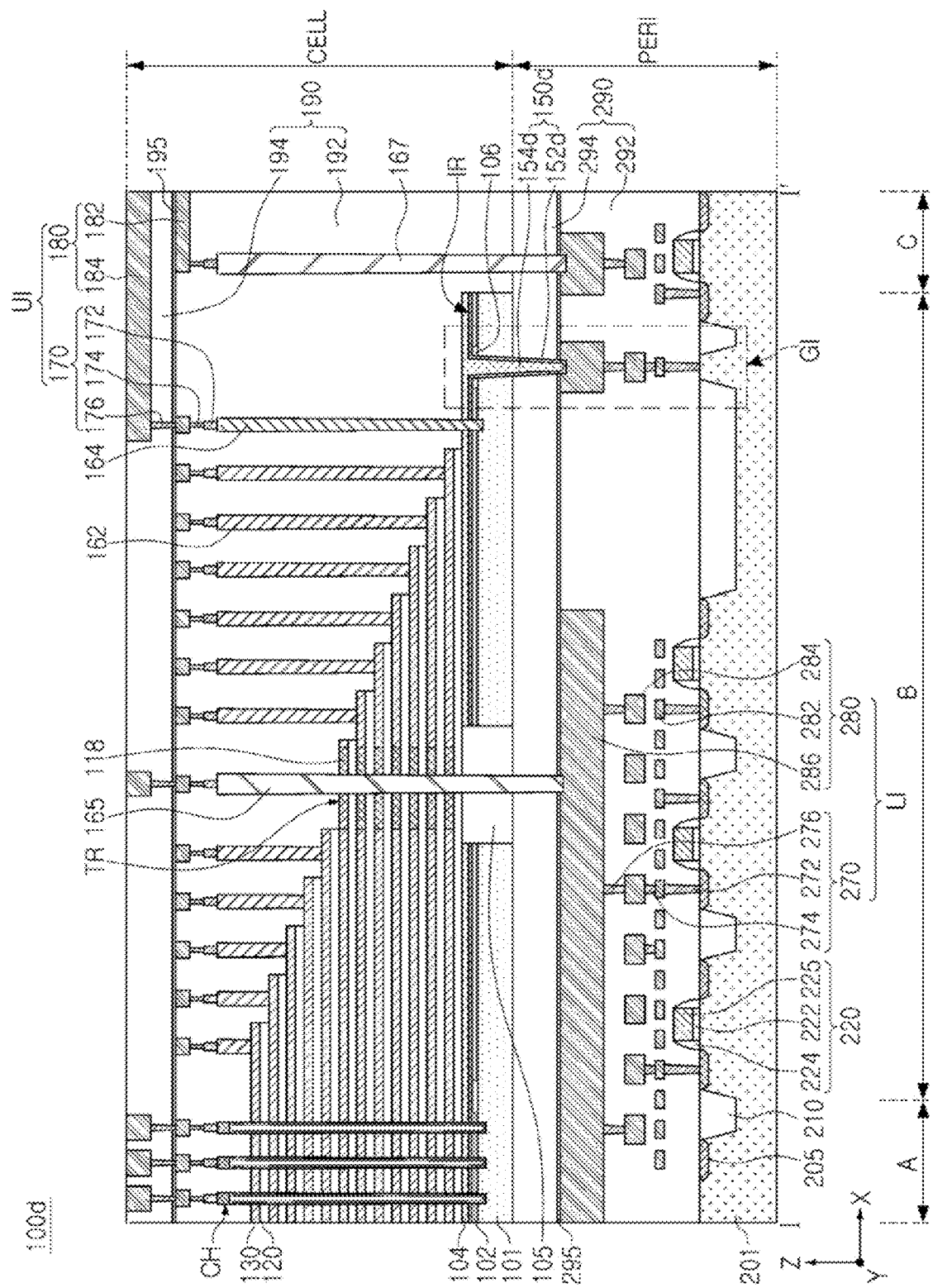
FIGS. 6A and 6B are schematic cross-sectional views of a semiconductor device according to an exemplary embodiment of the present disclosure.
Figure 6B:
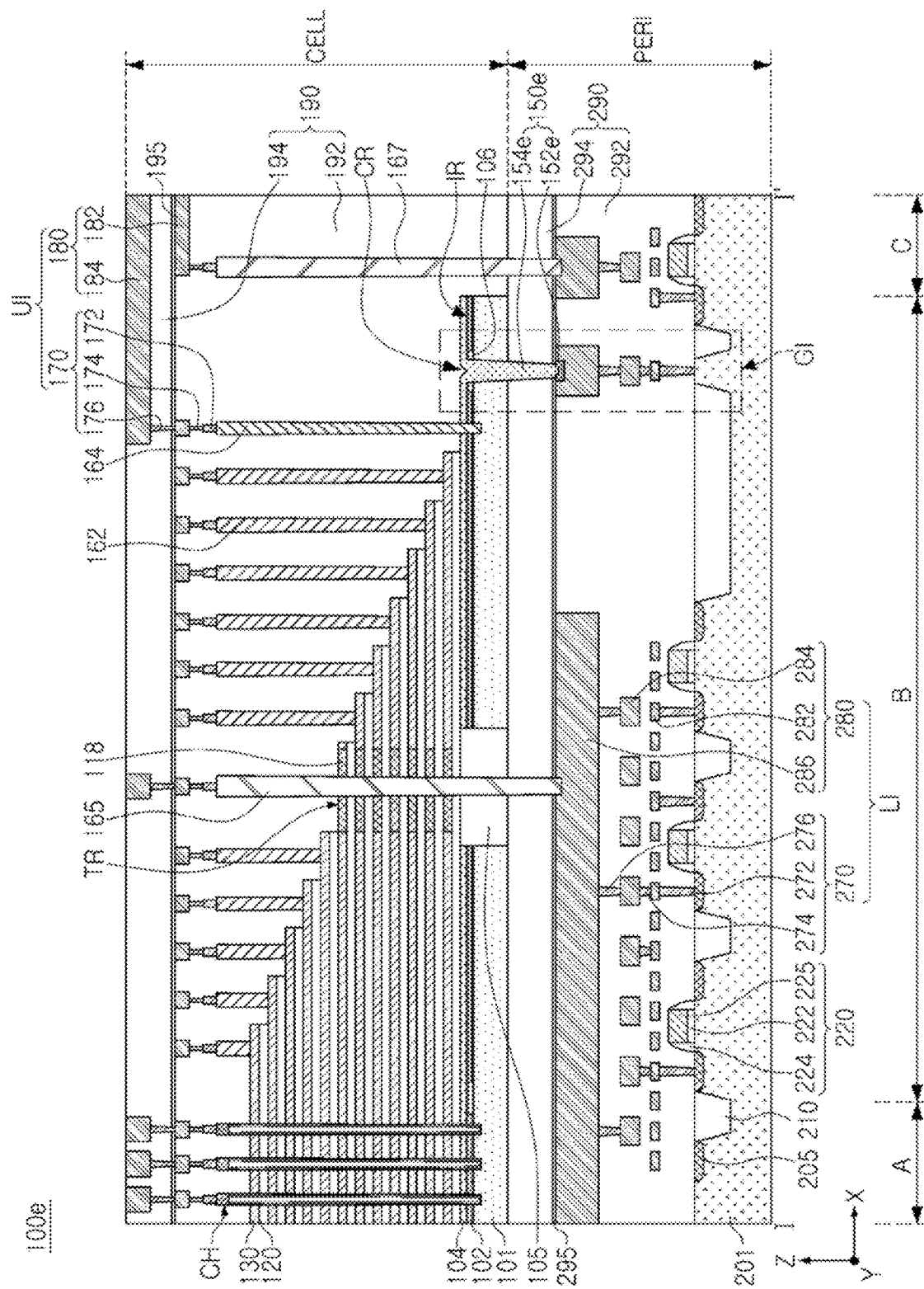

FIGS. 6A and 6B are schematic cross-sectional views of a semiconductor device according to an exemplary embodiment.

Referring to FIG. 6A, according to an embodiment, in a ground wiring structure GI of a semiconductor device 100d, an upper via 150d includes a barrier layer 152d and a via conductive layer integrated with a second horizontal conductive layer 104.

According to an embodiment, the barrier layer 152d extends from a bottom surface and a side surface of a via hole to a lower surface of the second horizontal conductive layer 104. The barrier layer 152d extends to the first region A along the second horizontal conductive layer 104, but embodiments are not limited thereto.

According to an embodiment, the via conductive layer 154d extends from the second horizontal conductive layer 104 and is integrated with the second horizontal conductive layer 104. Accordingly, the via conductive layer 154d includes the same material as the second horizontal conductive layer 104, and may include, for example, a semiconductor material.

According to an embodiment, the structure of the upper via 150d is formed by forming a via hole before the second horizontal conductive layer 104 is formed, forming the barrier layer 152d, and forming the via conductive layer 154d while the second horizontal conductive layer 104 is formed.

Referring to FIG. 6B, according to an embodiment, a ground wiring structure GI of a semiconductor device 100e includes an upper via 150e that includes a barrier layer 152e disposed on a bottom surface of the via hole and a via conductive layer 154e integrated with the second horizontal conductive layer 104.

Different from an exemplary embodiment in FIG. 6A, the barrier layer 152e is disposed on a lower end in contact with third lower wiring lines 286. The barrier layer 152e is formed by, for example, a nitridation process. In this case, since the barrier layer 152e is formed while partially consuming the lower third lower wiring line 286 below the barrier layer 152e, the barrier layer 152e extends both upward and downward from a boundary of the via hole and has a predetermined a thickness at a lower end of the via hole.

According to an embodiment, the via conductive layer 154e is integrated with the second horizontal conductive layer 104 similar to the exemplary embodiment in FIG. 6A, and has a recessed portion CR in an upper portion of the via conductive layer 154e, different from the exemplary embodiment in FIG. 6A. The recessed portion CR is formed in an upper surface of the via conductive layer 154e, and a center of the recessed portion CR is substantially aligned with a vertical center line of the upper via 150e.

According to an embodiment, the shapes of the barrier layer 152e and the recessed portion CR can be independently incorporated into other embodiments.

Figure 7:
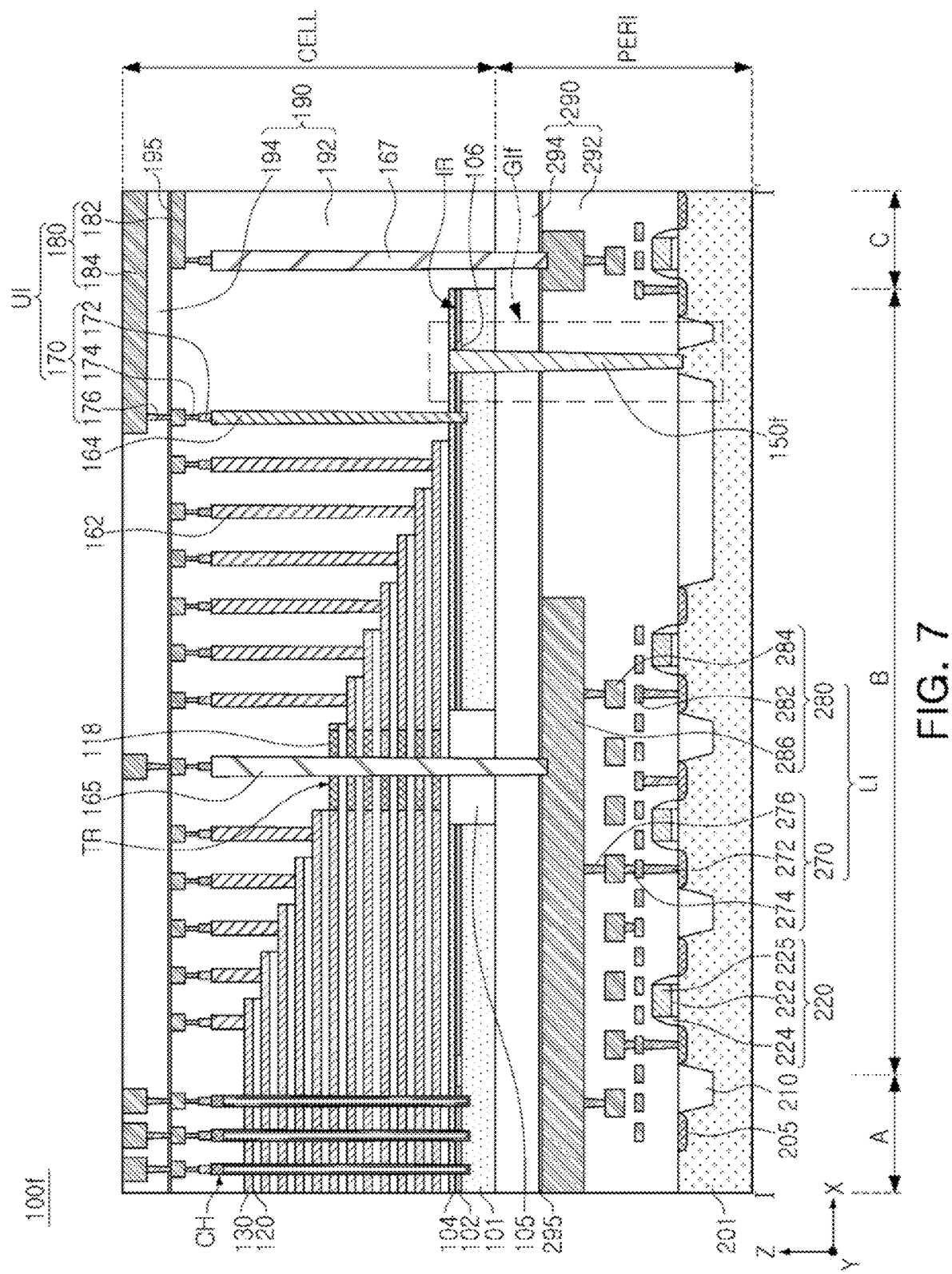
FIG. 7 is a schematic cross-sectional view of a semiconductor device according to an exemplary embodiment of the present disclosure.

FIG. 7 is a schematic cross-sectional view of a semiconductor device according to an exemplary embodiment.

Referring to FIG. 7, a ground wiring structure GIf of a semiconductor device 100f includes only an upper via 150f.

According to an embodiment, the upper via 150f is not connected to a lower wiring structure and extends from a second horizontal conductive layer 104 to the first substrate 201. Different from an exemplary embodiment in FIG. 2A, the upper via 150f in an exemplary embodiment does not include the barrier layer 152, but embodiments are not limited thereto. In exemplary embodiments, the upper via 150f includes a barrier layer 152 as in an exemplary embodiment in FIG. 2A, or may include a barrier layer 152e disposed at a lower end as in an exemplary embodiment in FIG. 6B. The presence or absence of a barrier layer and a dispositional form thereof may vary depending on materials of the upper via 150f and the first substrate 201. In addition, the upper via 150f has a diameter relatively larger than that of the upper via 150 illustrated in an exemplary embodiment of FIG. 2A, but embodiments are not limited thereto.

Figure 8:
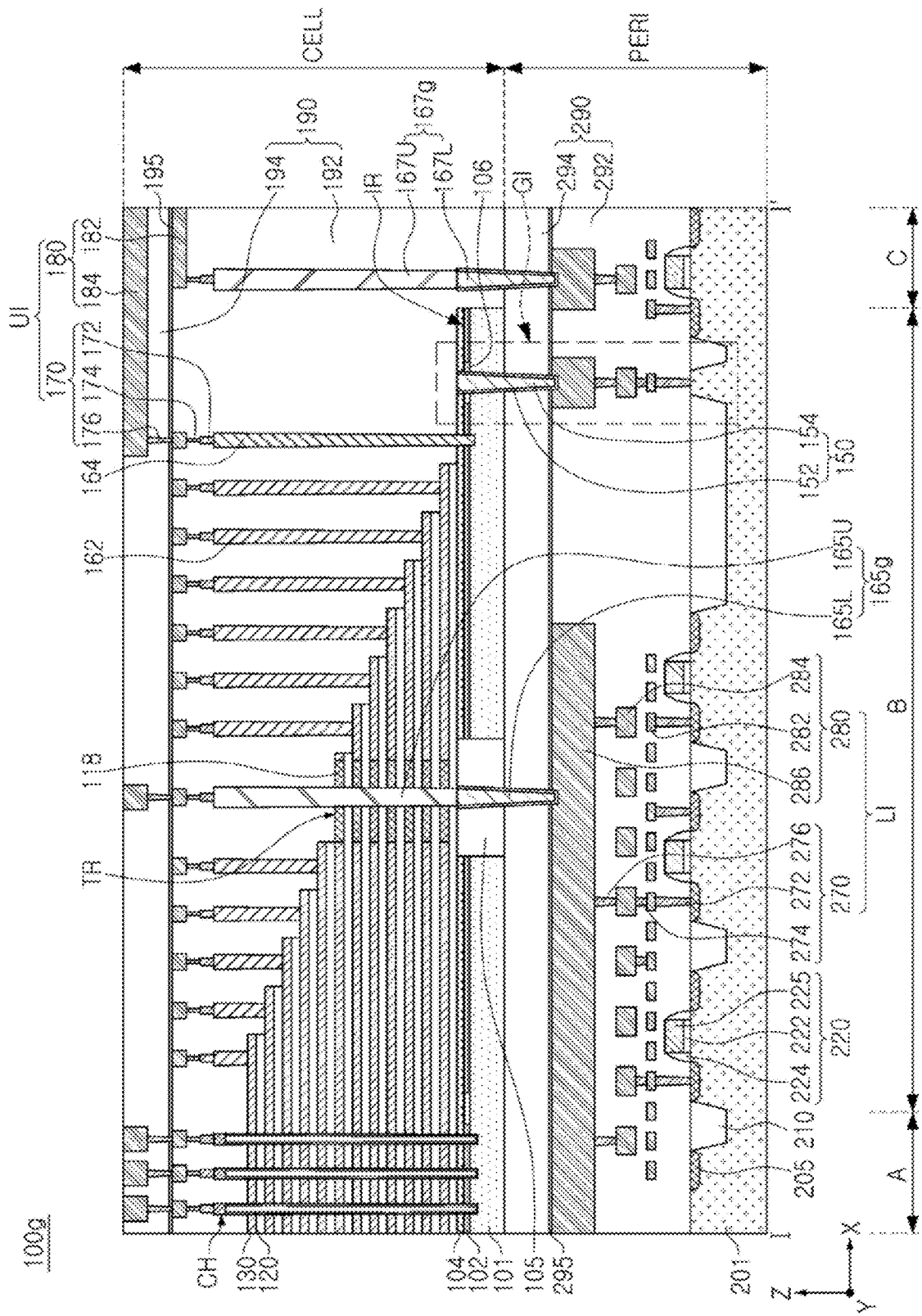
FIG. 8 is a schematic cross-sectional view of a semiconductor device according to an exemplary embodiment of the present disclosure.

FIG. 8 is a schematic cross-sectional view of a semiconductor device according to an exemplary embodiment.

Referring to FIG. 8, according to an embodiment, in a semiconductor device 100g, each of a first through via 165g of a through wiring region TR and a second through via 167g of a third region C has a component that corresponds to an upper via 150. First and second through vias 165g and 167g include first and second lower through vias 165L and 167L disposed at a level that corresponds to a level of the upper via 150, and first and second upper through vias 165U and 167U disposed on the first and second lower through vias 165L and 167L, respectively.

According to an embodiment, each of the first and second lower through vias 165L and 167L has the same internal structure as the upper via 150. For example, each of the first and second lower through vias 165L and 167L includes a barrier layer 152 and a via conductive layer 154, similar to the upper via 150. The first and second lower through vias 165L and 167L are formed in the same process as that which forms the upper via 150 such that each of the first and second lower through vias 165L and 167L has the same structure as the upper via 150. The first lower through via 165L penetrates the substrate insulating layer 105 and the second peripheral region insulating layer 294, and the second lower through via 167L penetrates the first cell region insulating layer 192 and the second peripheral region insulating layer 294. The first and second lower through vias 165L and 167L have substantially the same size and shape as the upper via 150, but embodiments are not limited thereto.

According to an embodiment, the first and second upper through vias 165U and 167U are disposed on the first and second lower through vias 165L and 167L and are connected to first upper contact plugs 172 of the second wiring structure UI.

According to an embodiment, since the first and second through vias 165g and 167g include the first and second lower through vias 165L and 167L, which can be formed together with the upper via 150, and the first and second upper through vias 165U and 167U, the first and second through vias 165g and 167g can stably connect the first wiring structure LI to the second wiring structure UI, even when the first and second through vias 165g and 167g are relatively long.

Figure 9:
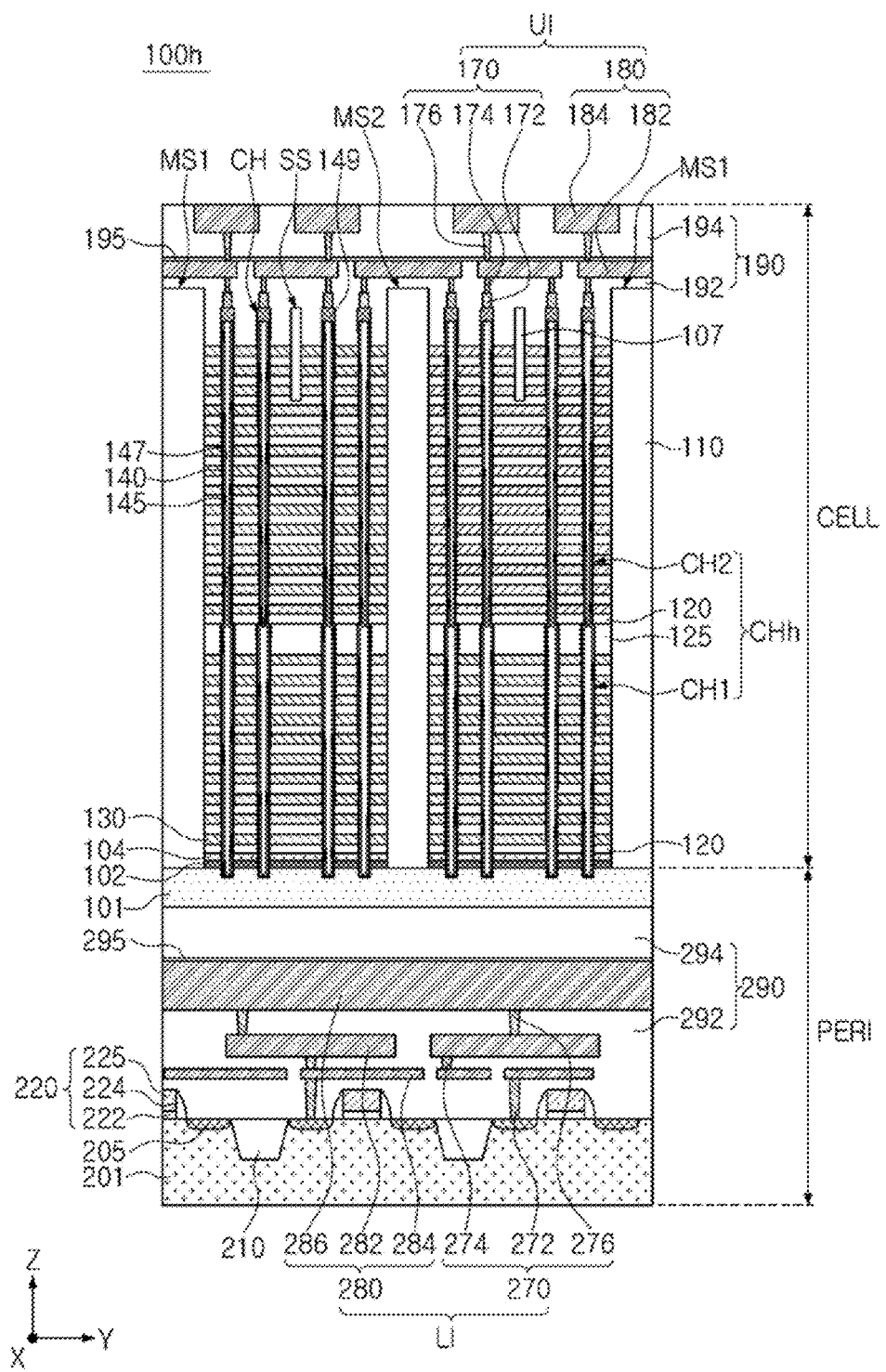
FIG. 9 is a schematic cross-sectional view of a semiconductor device according to an exemplary embodiment of the present disclosure.

FIG. 9 is a schematic cross-sectional view of a semiconductor device according to an exemplary embodiment.

Referring to FIG. 9, according to an embodiment, in a semiconductor device 100h, a stack structure of gate electrodes 130 includes vertically stacked lower and upper stack structures, and channel structures CHh include vertically stacked first and second channel structures CH1 and CH2. The above-described structure can be used to stably form the channel structures CHh when the number of the stacked gate electrodes 130 is relatively large.

According to an embodiment, the channel structures CHh include first channel structures CH1 disposed in a lower portion that are connected to second channel structures CH2 disposed in an upper portion, and the channel structures CHh have a stepped portion formed by a difference in width in a connection region. The channel layer 140, the gate dielectric layer 145, and the channel filling insulating layer 147 are connected to each other between the first channel structure CH1 and the second channel structure CH2. The channel pad 149 are disposed only on an upper end of the second channel structure CH2 in the upper portion. Alternatively, in exemplary embodiments, each of the first channel structure CH1 and the second channel structure CH2 includes the channel pad 149, and in this case, the channel pad 149 of the first channel structure CH1 is connected to the channel layer 140 of the second channel structure CH2. A relatively thick upper interlayer insulating layer 125 is disposed on an uppermost portion of the lower stack structure. Shapes of the interlayer insulating layers 120 and the upper interlayer insulating layer 125 may vary in exemplary embodiments.

FIGS. 10A to 10K illustrate a method of manufacturing a semiconductor device according to an exemplary embodiment, in particular those regions that are illustrated in FIG. 2A.

Figure 10A:
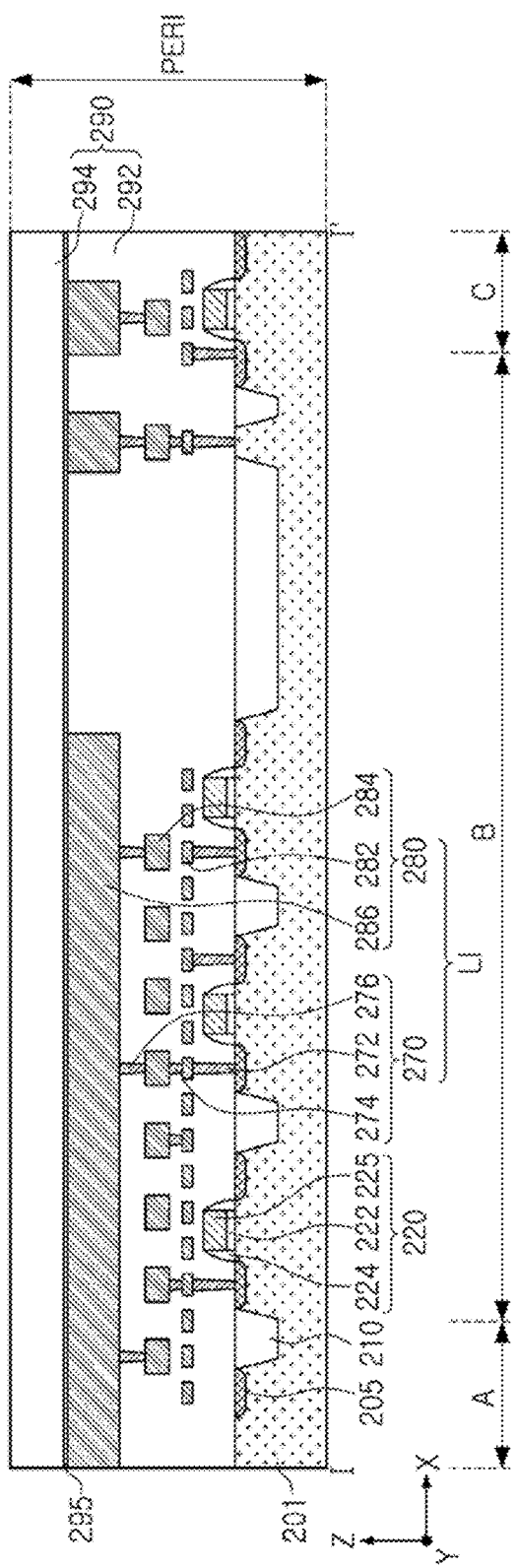
FIGS. 10A to 10K illustrate a method of manufacturing a semiconductor device according to an exemplary embodiment of the present disclosure.

Referring to FIG. 10A, according to an embodiment, circuit devices 220 and a first wiring structure LI that form a peripheral circuit region PERI are formed on the first substrate 201.

First, according to an embodiment, device isolation layers 210 are formed in the first substrate 201, and a circuit gate dielectric layer 222 and a circuit gate electrode 225 are sequentially formed on the first substrate 201. The device isolation layers 210 may be formed by, for example, a shallow trench isolation (STI) process. The circuit gate dielectric layer 222 and the circuit gate electrode 225 may be formed using atomic layer deposition (ALD) or chemical vapor deposition (CVD). The circuit gate dielectric layer 222 may be formed of silicon oxide, and the circuit gate electrode 225 may be formed of at least one of polysilicon or a metal silicide layer, but embodiments thereof are not limited thereto. Thereafter, a spacer layer 224 and source/drain regions 205 are formed at both sidewalls of the circuit gate dielectric layer 222 and the circuit gate electrode 225. In exemplary embodiments, the spacer layer 224 may include a plurality of layers. Thereafter, the source/drain regions 205 are formed by performing an ion implantation process.

According to an embodiment, the lower contact plugs 270 of the first wiring structure LI are formed by partially forming the first peripheral region insulating layer 292, partially removing the first peripheral region insulating layer 292 by etching, and filling the removed region with a conductive material. The lower wiring lines 280 are formed by, for example, depositing a conductive material and patterning the conductive material. When the first wiring structure LI is formed, a lower wiring structure that forms a portion of the ground wiring structure GI, shown in FIG. 2A, is also formed. Accordingly, the lower wiring structure has the same stack structure as that of the first wiring structure LI.

According to an embodiment, the first peripheral region insulating layer 292 includes a plurality of insulating layers. The first peripheral region insulating layer 292 is partially formed in each process that forms the first wiring structure LI. A lower protective layer 295 that covers an upper surface of the third lower wiring line 286 is formed on the first peripheral region insulating layer 292. A second peripheral region insulating layer 294 is formed on the lower protective layer 295. Accordingly, the entire peripheral circuit region PERI can be formed.

Figure 10B:
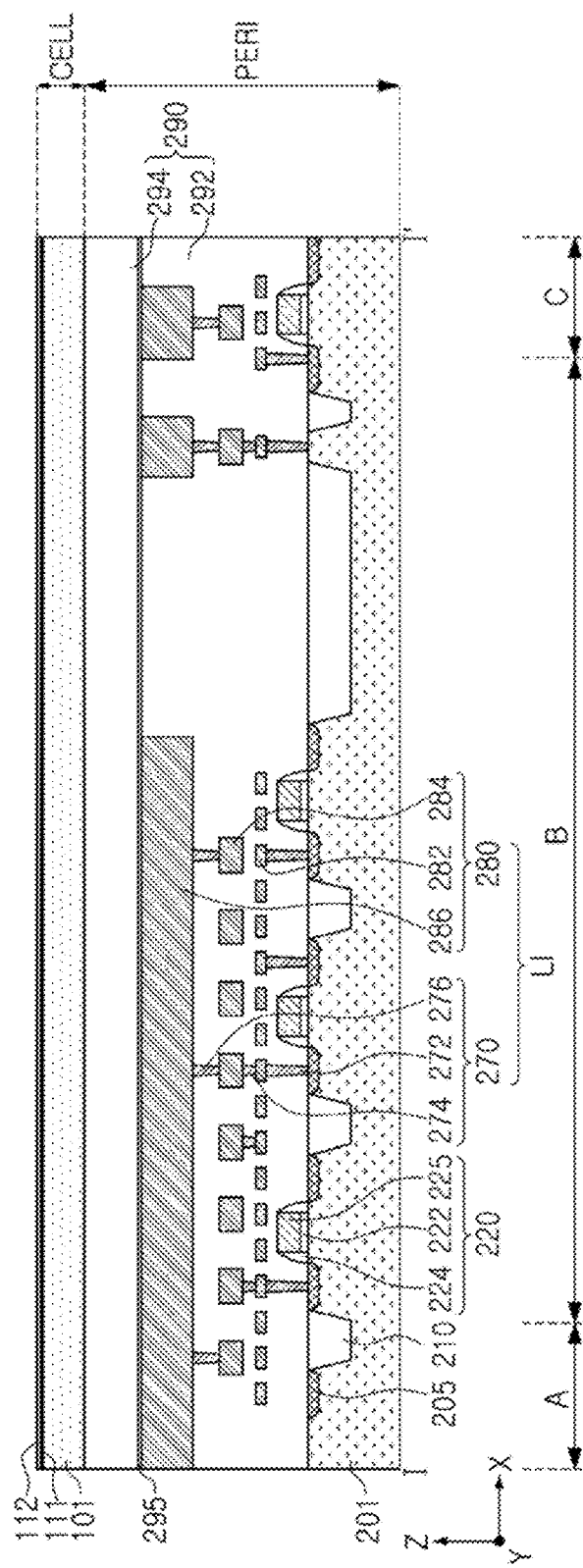
Figure 10C:
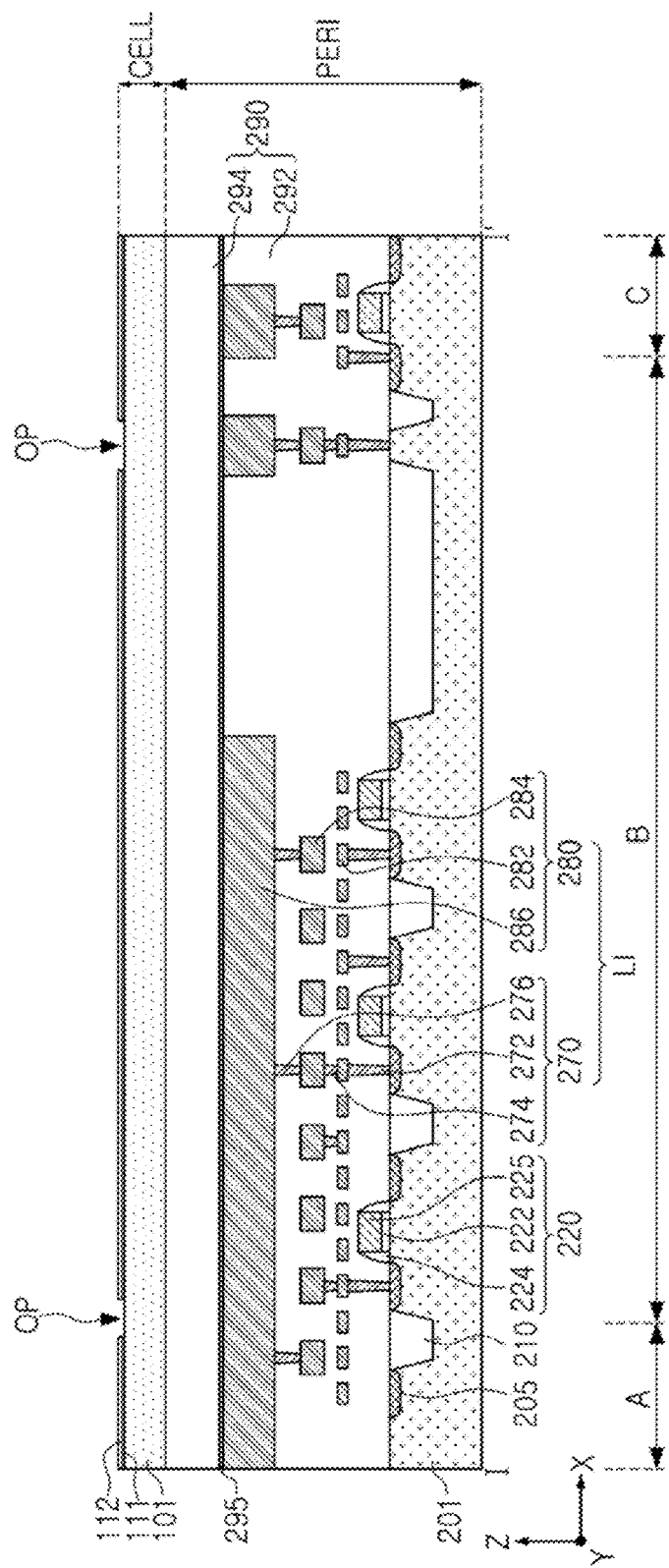
Figure 10D:
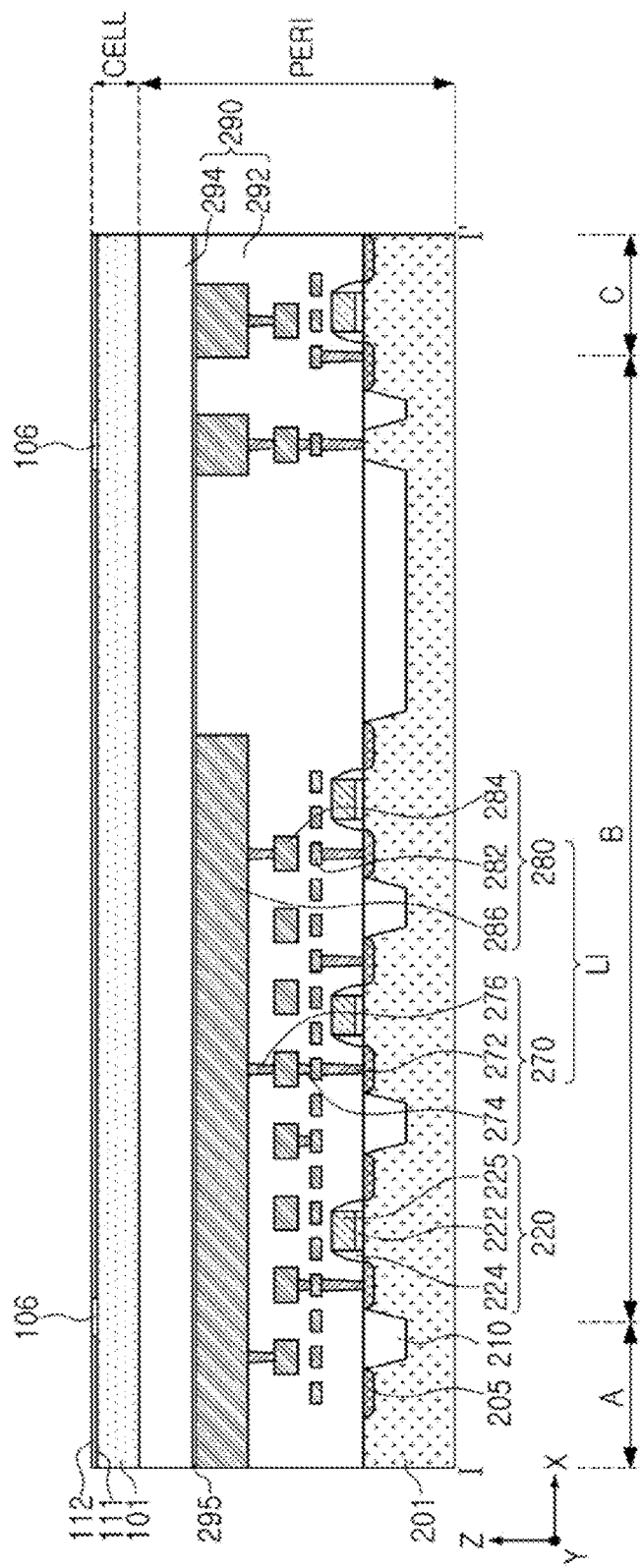
Figure 10E:
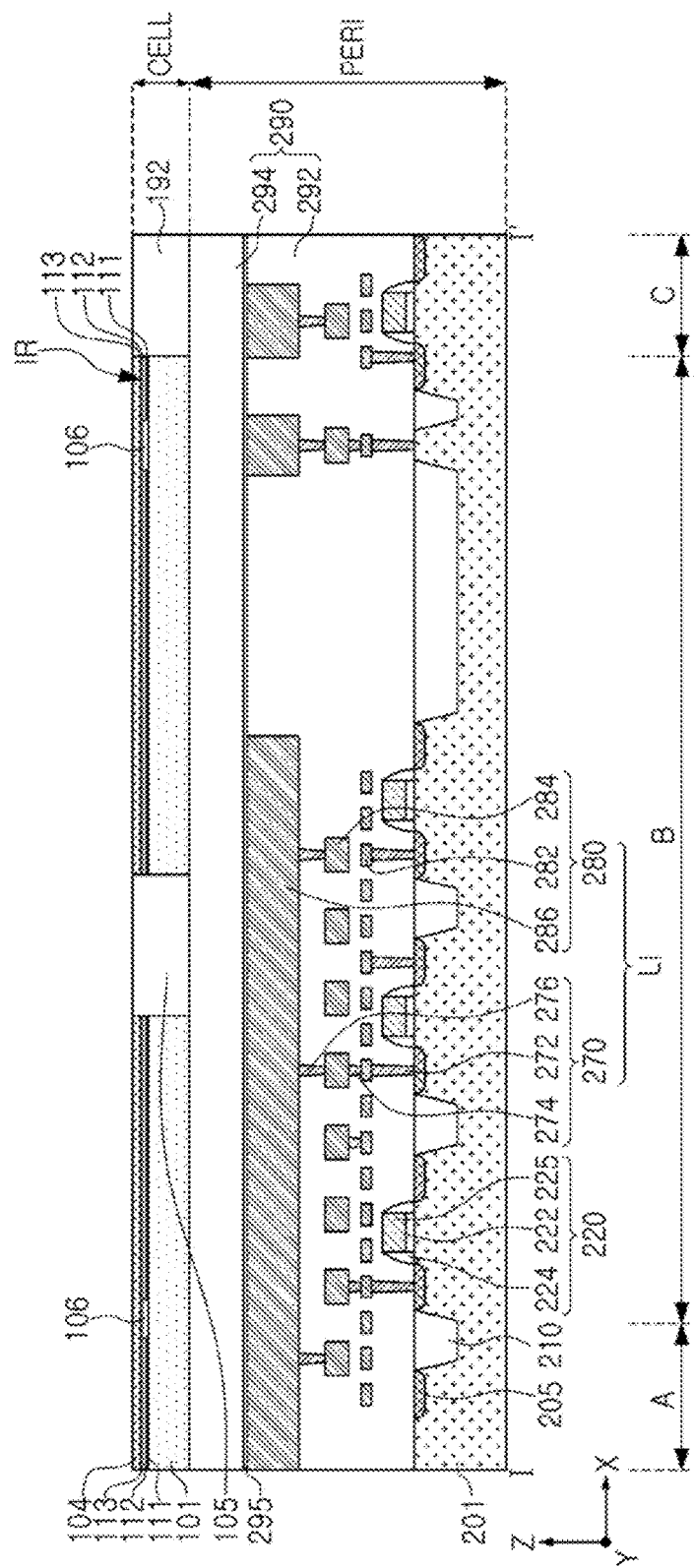
Figure 10F:
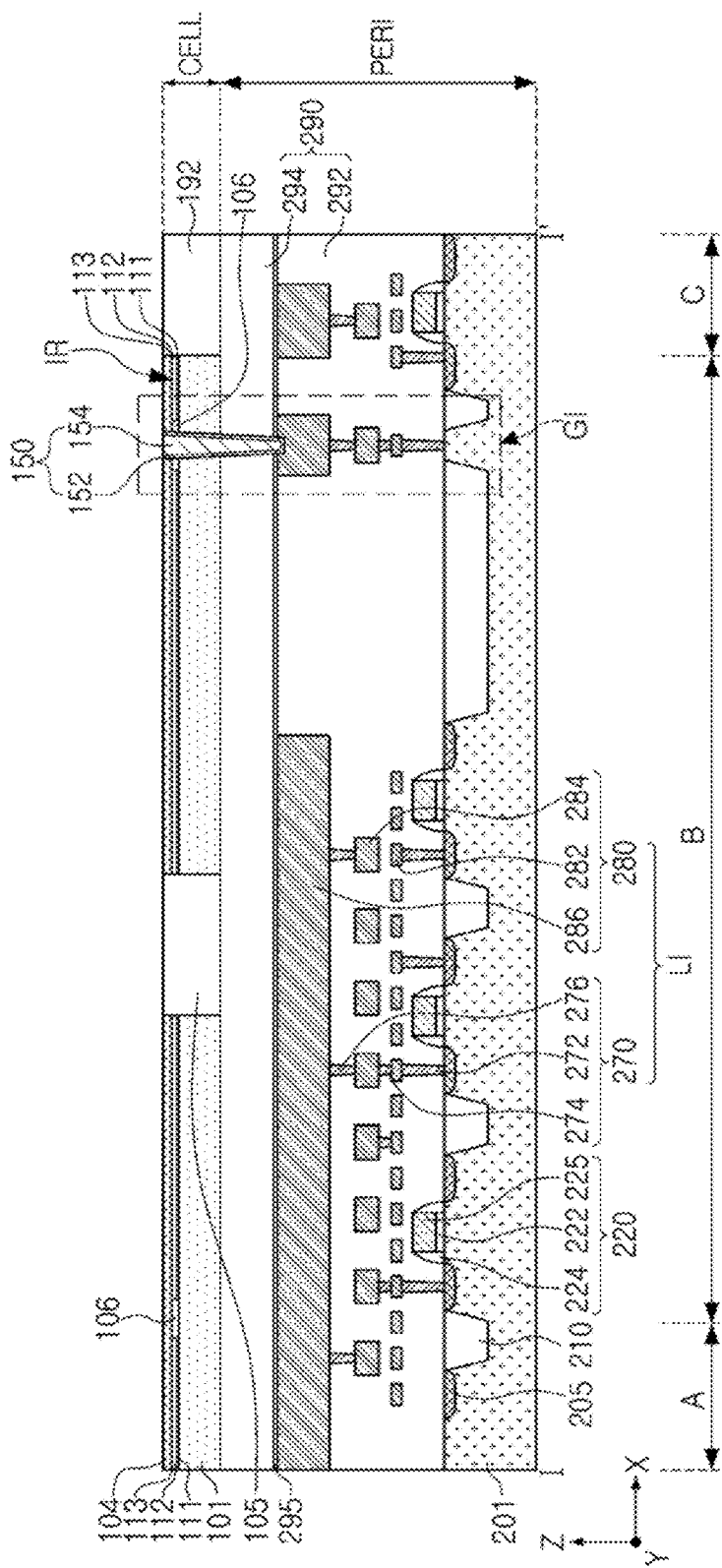
Figure 10G:
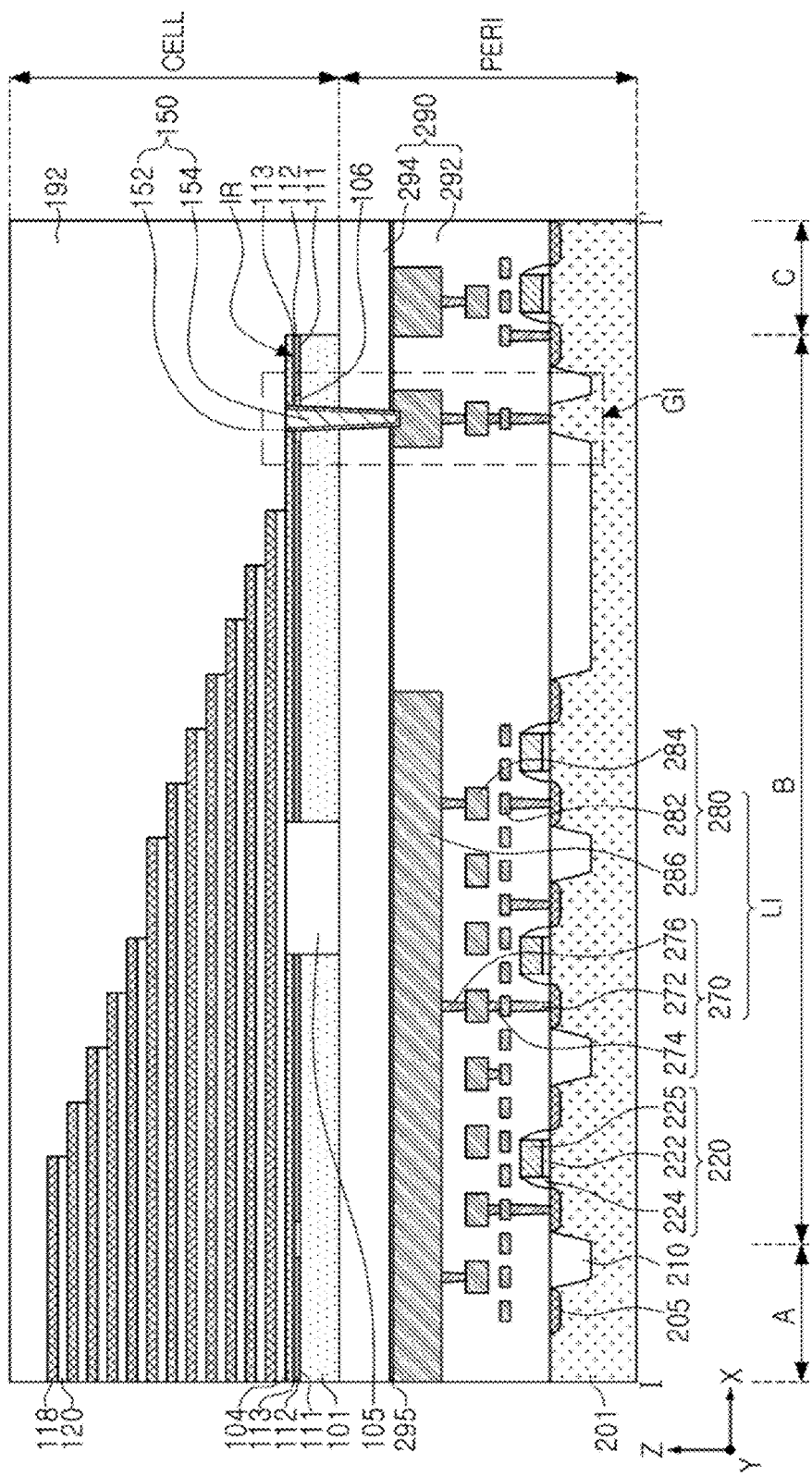
Figure 10H:
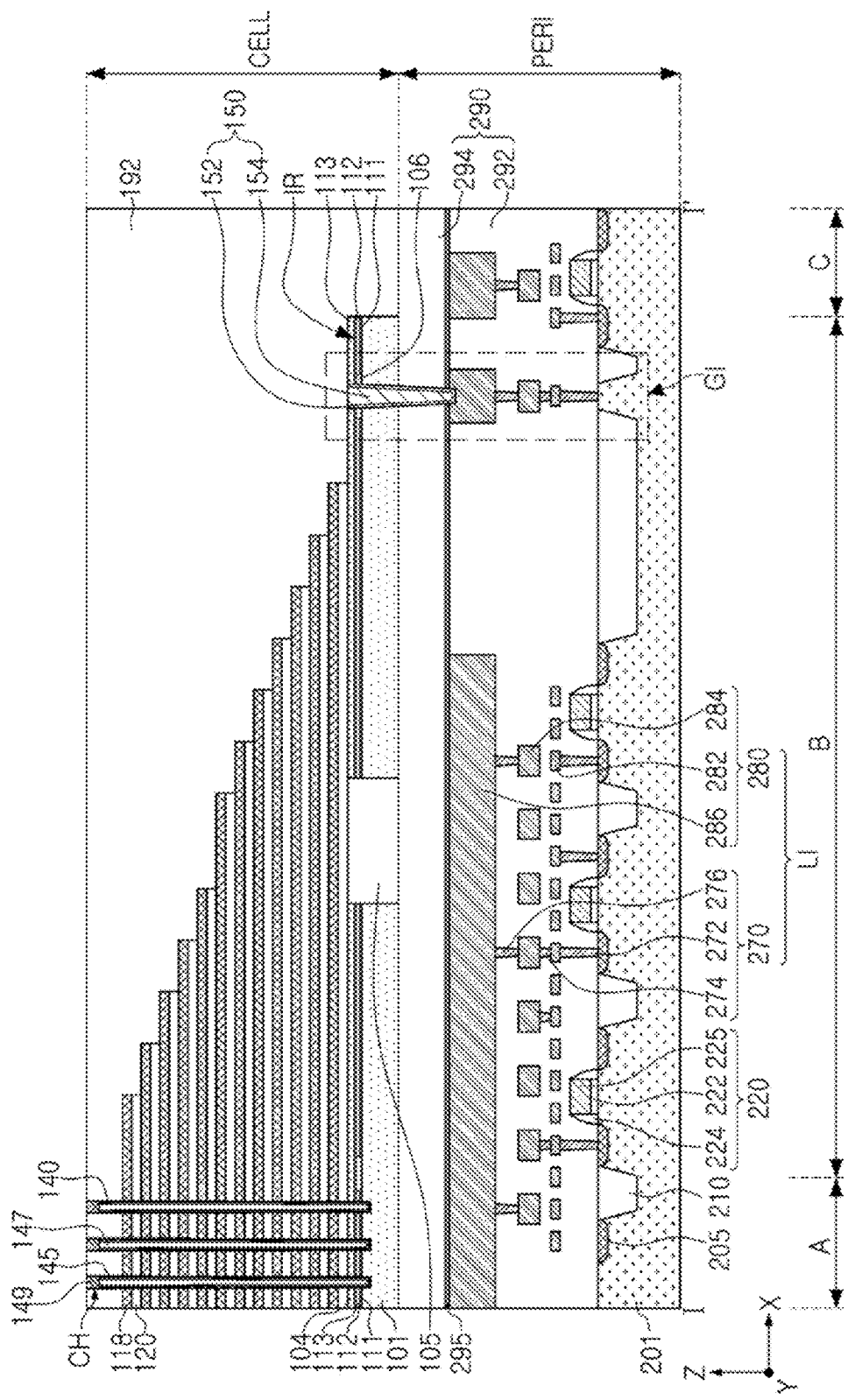
Figure 10I:
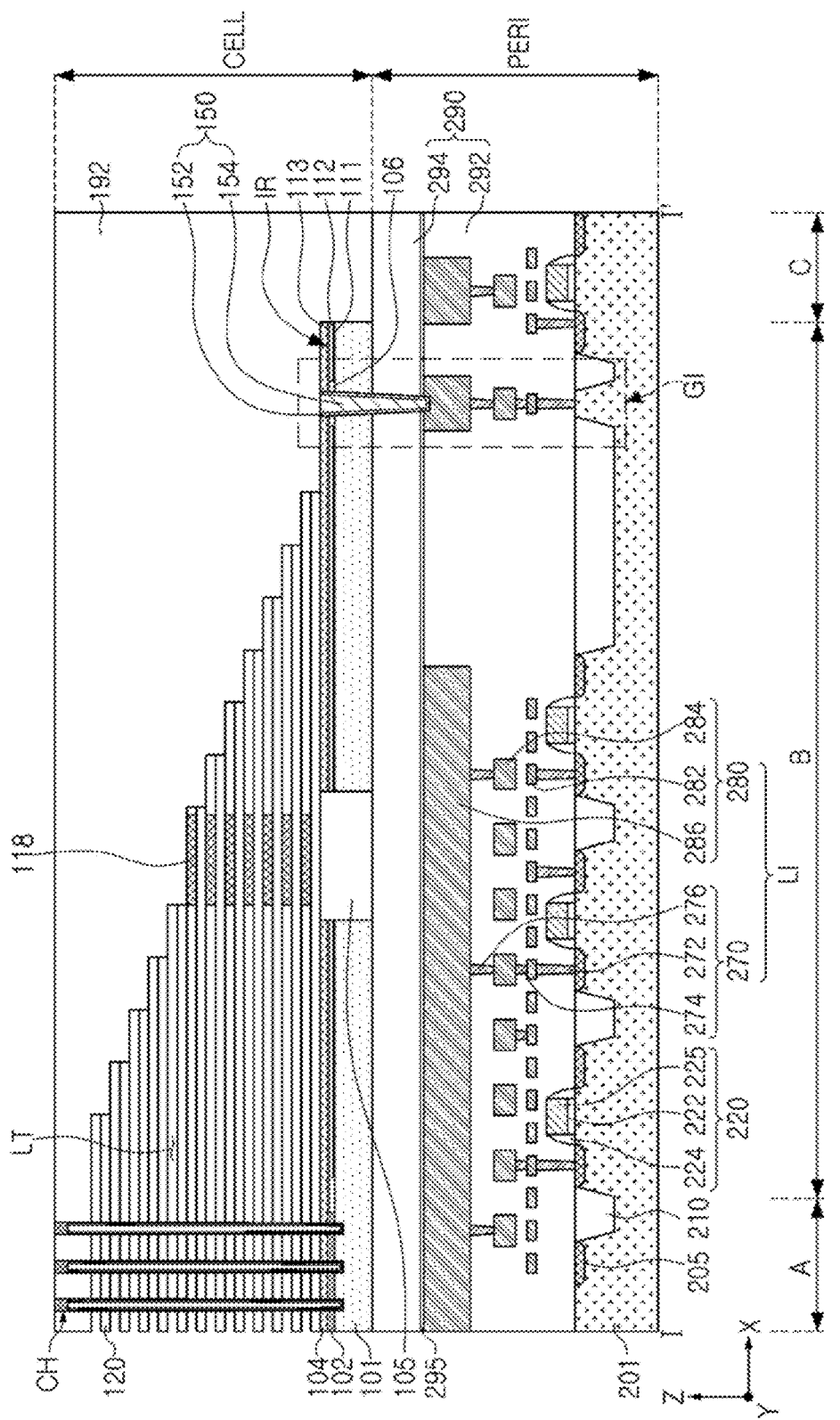

Referring to FIG. 10I3, according to an embodiment, a second substrate 101 of a memory cell region CELL and first and second horizontal sacrificial layers 111 and 112 are formed above the peripheral circuit region PERI.

According to an embodiment, the second substrate 101 is formed of, for example, polycrystalline silicon, and may be formed by a CVD process. The polycrystalline silicon that forms the second substrate 101 may include impurities, such as n-type impurities. The second substrate 101 is formed on the entire second peripheral region insulating layer 294 and is patterned in a subsequent process.

According to an embodiment, the first and second horizontal sacrificial layers 111 and 112 are sequentially stacked on the second substrate 101. The first and second horizontal sacrificial layers 111 and 112 include different materials. The first and second horizontal sacrificial layers 111 and 112 are replaced with the first horizontal conductive layer 102 illustrated in FIG. 2A along with the third horizontal sacrificial layer 113, as illustrated in FIG. 10E, below, formed through a subsequent process in the first region A. For example, the first horizontal sacrificial layer 111 is formed of the same material as that of the interlayer insulating layers 120, and the second horizontal sacrificial layer 112 is formed of the same material as that of the sacrificial insulating layers 118.

Referring to FIG. 10C, according to an embodiment, openings OP are formed by partially removing the first and second horizontal sacrificial layers 111 and 112.

According to an embodiment, the first and second horizontal sacrificial layers 111 and 112 are removed by being patterned in regions of the second region B in which the supporting insulating layer 106 and the first and second separation regions MS1 and MS2 are disposed, as illustrated in FIG. 1.

Referring to FIG. 10D, a supporting insulating layer 106 is formed that fills the openings OP.

According to an embodiment, the supporting insulating layer 106 is formed and fills the opening OP by depositing and planarizing an insulating material. An upper surface of the supporting insulating layer 106 is substantially coplanar with an upper surface of the second horizontal sacrificial layer 112. The supporting insulating layer 106 covers side surfaces of the first and second horizontal sacrificial layers 111 and 112.

Referring to FIG. 10E, according to an embodiment, a third horizontal sacrificial layer 113, a second horizontal conductive layer 104, and a substrate insulating layer 105 are formed.

According to an embodiment, the third horizontal sacrificial layer 113 covers an upper surface of the second horizontal sacrificial layer 112 and an upper surface of the supporting insulating layer 106. By forming the third horizontal sacrificial layer 113, an insulating region IR that includes the first to third horizontal sacrificial layers 111, 112, and 113 and the supporting insulating layer 106 can be formed. The second horizontal conductive layer 104 is formed on the third horizontal sacrificial layer 113. Each of the third horizontal sacrificial layer 113 and the second horizontal conductive layer 104 has a substantially planar upper surface.

According to an embodiment, the substrate insulating layer 105 is formed by partially removing the second horizontal conductive layer 104, the first to third horizontal sacrificial layers 111, 112, and 113, and the second substrate 101, and filling the removed region with an insulating material in the through wiring region TR, shown in FIG. 2A. In this process, the second substrate 101, the first to third horizontal sacrificial layers 111, 112 and 113, and the second horizontal conductive layer 104 are patterned such that a portion of the first cell region insulating layer 192 is formed in a third region C of the memory cell region CELL. The portion of the first cell region insulating layer 192 is formed together with the substrate insulating layer 105, but embodiments thereof are not limited thereto. In addition, in exemplary embodiments, a process of patterning the second substrate 101 can be a separate process.

Referring to FIG. 10F, according to an embodiment, a ground wiring structure GI is formed by forming an upper via 150.

According to an embodiment, the upper via 150 is formed by forming a via hole by partially removing the second horizontal conductive layer 104, the insulating region IR, the second substrate 101, the second peripheral region insulating layer 294, and the lower protective layer 295, and sequentially depositing the barrier layer 152 and the via conductive layer 154 in the via hole.

According to an embodiment, the via hole exposes the third lower wiring line 286 of the lower wiring structure of the ground wiring structure GI. In exemplary embodiments, when the via hole is formed, the lower protective layer 295 functions as an etch stop layer. The via hole is partially recessed into the third lower wiring line 286, but embodiments thereof are not limited thereto. For example, the via hole can expose an upper surface of the third lower wiring line 286.

According to an embodiment, the upper via 150 is connected to the second horizontal conductive layer 104 and the second substrate 101 through a side surface thereof, and electrically connects the second horizontal conductive layer 104 and the second substrate 101 to a ground region of the first substrate 201.

Referring to FIG. 10G, according to an embodiment, sacrificial insulating layers 118 and interlayer insulating layers 120 are alternately stacked on the second horizontal conductive layer 104.

According to an embodiment, the sacrificial insulating layers 118 are partially replaced with gate electrodes 130, shown in FIG. 2A, through a subsequent process. The sacrificial insulating layers 118 are formed of a material that differs from that of the interlayer insulating layers 120, and the material has an etch selectivity that differs from that of the interlayer insulating layers 120 under predetermined etching conditions. For example, the interlayer insulating layer 120 may be formed of at least one of silicon oxide of silicon nitride, and the sacrificial insulating layers 118 may be formed of a different material selected from silicon, silicon oxide, silicon carbide, or silicon nitride. In exemplary embodiments, the interlayer insulating layers 120 do not have the same thickness. The thicknesses of the interlayer insulating layers 120 and the sacrificial insulating layers 118 and the number of layers of each of the interlayer insulating layers 120 and the sacrificial insulating layers 118 may vary, different from an exemplary embodiment shown in FIG. 10G.

According to an embodiment, a photolithography process and an etching process are repetitively performed on the sacrificial insulating layers 118 in the second region B using a mask layer such that the sacrificial insulating layers 118 in an upper portion extend less far than the sacrificial insulating layers 118 in a lower portion. Accordingly, the sacrificial insulating layers 118 have a staircase shape with stepped portions in a predetermined unit.

Thereafter, according to an embodiment, a first cell region insulating layer 192 is formed that covers the stack structure of the sacrificial insulating layers 118 and the interlayer insulating layers 120.

Referring to FIG. 10H, according to an embodiment, channel structures CH are formed that penetrates the stack structure of the sacrificial insulating layers 118 and the interlayer insulating layers 120.

First, according to an embodiment, upper separation regions SS, shown in FIG. 2B, are formed by partially removing the sacrificial insulating layers 118 and the interlayer insulating layers 120. The upper separation regions SS are formed by exposing a region using a mask layer, removing a predetermined number of the sacrificial insulating layers 118 and the interlayer insulating layers 120 from an uppermost portion, and depositing an insulating material.

According to an embodiment, the channel structures CH are formed by anisotropically etching the sacrificial insulating layers 118 and the interlayer insulating layers 120 using a mask layer, and by forming hole-shaped channel holes and filling the holes. When a plasma dry etching process is used to form the channel holes, a potential difference may occur between upper and lower portions of the channel holes due to ions generated in the channel holes. However, as the second horizontal conductive layer 104 and the second substrate 101 are connected to the first substrate 201 by the ground wiring structure GI, positive ions can flow to the first substrate 201, negative ions can flow from an edge of a wafer to the first substrate 201 through the mask layer such that an arcing defect that may be caused by the potential difference is prevented.

According to an embodiment, due to a height of the stack structure, sidewalls of the channel structures CH might not be perpendicular to an upper surface of the second substrate 101. The channel structures CH are recessed into a portion of the second substrate 101. Thereafter, at least a portion of the gate dielectric layer 145, the channel layer 140, the channel filling insulating layer 147, and the channel pad 149, are sequentially formed in the channel structures CH.

According to an embodiment, the gate dielectric layer 145 is formed using an ALD or CVD process and has a uniform thickness. In this process, the entirety of or a portion of the gate dielectric layer 145 is formed, and a portion that extends perpendicular to the second substrate 101 along the channel structures CH is formed in this process. The channel layer 140 is formed on the gate dielectric layer 145 in the channel structures CH. The channel filling insulating layer 147 is formed of an insulating material and fills the channel structures CH. However, in exemplary embodiments, a region between the channel layers 140 may be filled with a conductive material rather than the channel filling insulating layer 147. The channel pad 149 is formed of a conductive material, such as polycrystalline silicon.

Referring to FIG. 10I, according to an embodiment, openings are formed that penetrate the stack structure of the sacrificial insulating layers 118 and the interlayer insulating layers 120 in regions that correspond to the first and second separation regions MS1 and MS2, shown in FIG. 1, and tunnel portions LT are formed by partially removing the sacrificial insulating layers 118 through the openings.

First, according to an embodiment, the openings penetrate the stack structure of the sacrificial insulating layers 118 and the interlayer insulating layers 120 and the second horizontal conductive layer 104. Thereafter, the second horizontal sacrificial layer 112 is exposed by an etch-back process while sacrificial spacer layers are formed in the openings. The second horizontal sacrificial layer 112 is selectively removed from the exposed region in the first region A, and the first and third horizontal sacrificial layers 111 and 113 disposed above and below the second horizontal sacrificial layer 112 are removed.

According to an embodiment, the first to third horizontal sacrificial layers 111, 112, and 113 may be removed by a wet etching process, for example. In a process of removing the second horizontal sacrificial layer 112, an etchant can be prevented from flowing into the second horizontal conductive layer 104 by the supporting insulating layer 106 that covers a side surface of an end the second horizontal sacrificial layer 112, and the second horizontal conductive layer 104 is supported by the supporting insulating layer 106. During a process of removing the first and third horizontal sacrificial layers 111 and 113, a portion of the gate dielectric layer 145 exposed where the second horizontal sacrificial layer 112 was removed is also removed. The first horizontal conductive layer 102 is formed by depositing a conductive material in a region from which the first to third horizontal sacrificial layers 111, 112 and 113 have been removed, and the sacrificial spacer layers are removed from the openings. By this process, the first horizontal conductive layer 102 is formed in the first region A, and the insulating region IR remains in the second region B.

Thereafter, according to an embodiment, the sacrificial insulating layers 118 are removed from an external side of the through wiring region TR, shown in FIG. 2A. The sacrificial insulating layers 118 remain in the through wiring region TR and form, along with the interlayer insulating layers 120, an insulating region of the through wiring region TR. The sacrificial insulating layers 118 may be selectively removed with respect to the interlayer insulating layers 120 using a wet etching process. Accordingly, a plurality of tunnel portions LT are formed between the interlayer insulating layers 120.

According to an embodiment, a region in which the through wiring region TR is formed is spaced apart from the openings such that an etchant does not reach the region and the sacrificial insulating layers 118 remain in the region. Accordingly, the through wiring region TR is formed in a center of the first and second separation regions MS1 and MS2 between adjacent first and second separation regions MS1 and MS2.

Figure 10J:
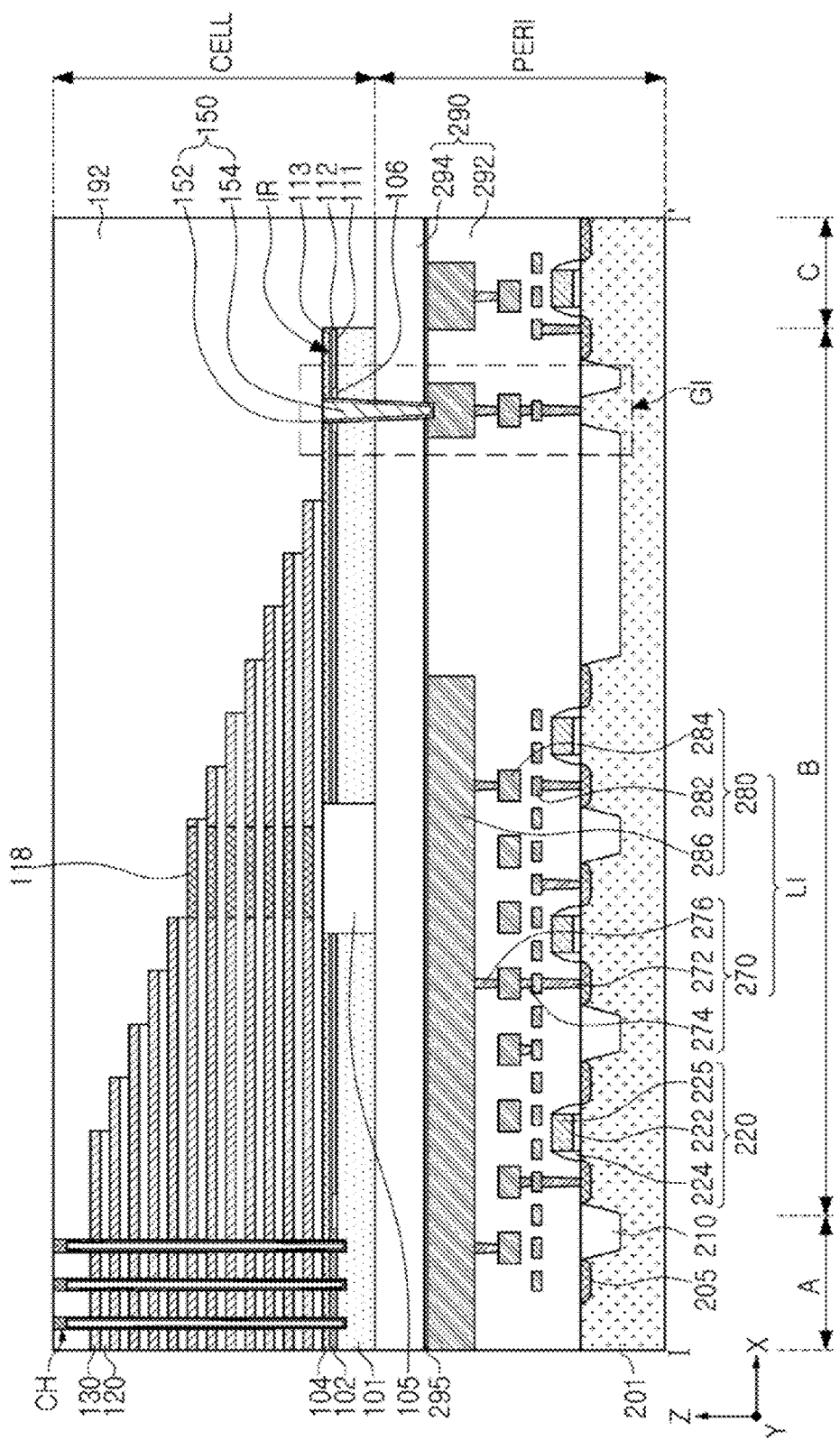

Referring to FIG. 10J, according to an embodiment, the gate electrodes 130 are formed by filling a conductive material into the tunnel portions LT from which the sacrificial insulating layers 118 have been partially removed.

According to an embodiment, the conductive material that forms the gate electrodes 130 fills the tunnel portions LT. Side surfaces of the gate electrodes 130 are in contact with side surfaces of the sacrificial insulating layers 118 of the through wiring region TR. The conductive material may include a metal, polycrystalline silicon, or a metal silicide. After the gate electrodes 130 are formed, the conductive material deposited in the openings is removed through an additional process, and the removed regions are filled with an insulating material, thereby forming the separation insulating layer 110, shown in FIG. 2B.

Figure 10K:
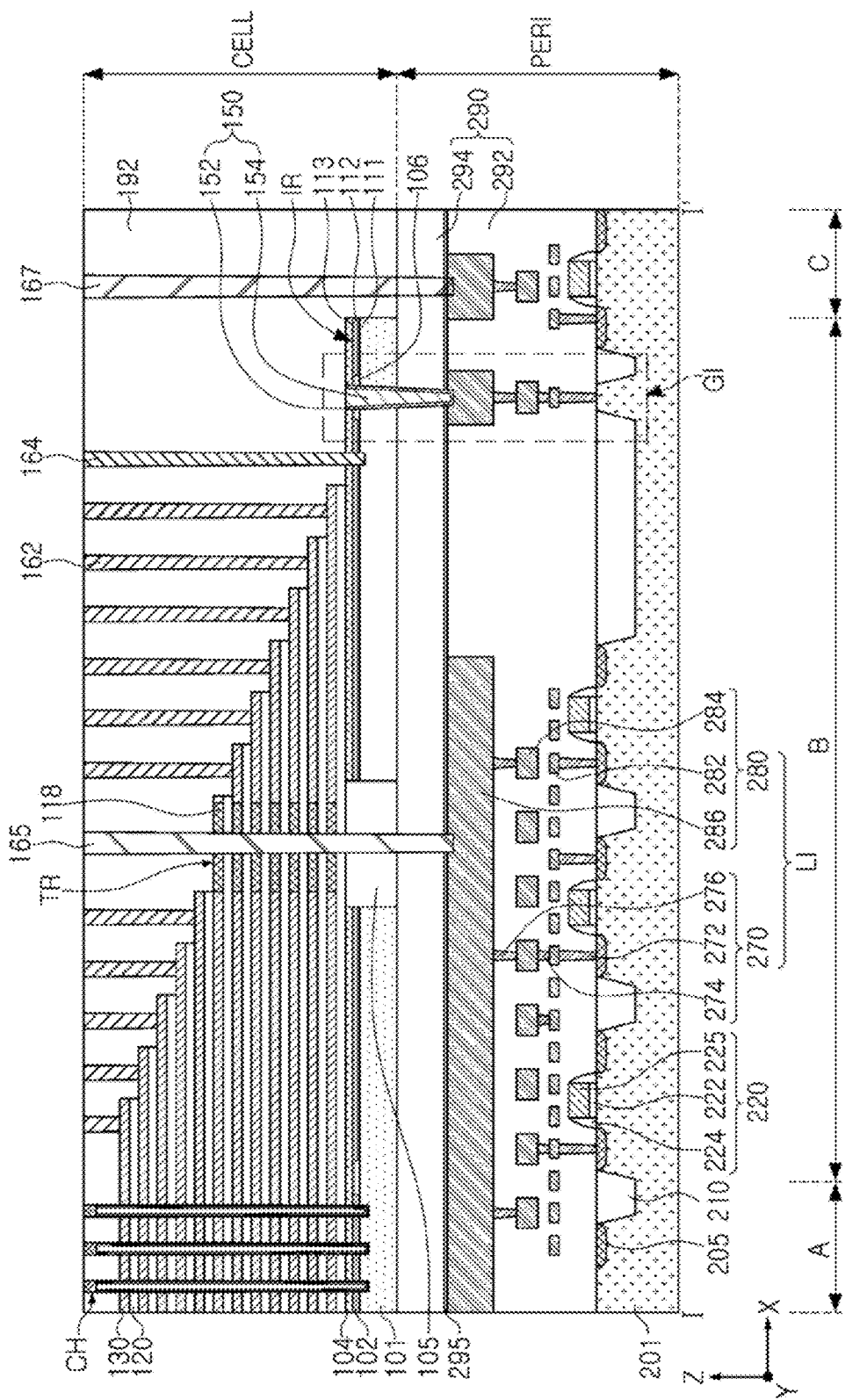

Referring to FIG. 10K, according to an embodiment, gate contacts 162, substrate contact 164, and first and second through vias 165 and 167 are formed that penetrate the first cell region insulating layer 192.

According to an embodiment, the gate contacts 162 are connected to the gate electrodes 130 in the second region B, and are connected to the second substrate 101 at an end of the second region B. The first through via 165 is connected to the first wiring structure LI of the peripheral circuit region PERI in the through wiring region TR, and the second through via 167 is connected to the first wiring structure LI of the peripheral circuit region PERI in the third region C.

According to an embodiment, the gate contacts 162, the substrate contact 164, and the first and second through vias 165 and 167 have different depths. The gate contacts 162, the substrate contact 164, and the first and second through vias 165 and 167 are formed by simultaneously forming contact holes using an etch stop layer and filling the contact holes with a conductive material. Alternatively, in exemplary embodiments, a portion of the gate contacts 162, the substrate contact 164, and the first and second through vias 165 and 167 are formed in different processes.

Thereafter, referring back to FIG. 2A, according to an embodiment, the second cell region insulating layer 194, the upper protective layer 195, and the upper wiring structure UI are formed.

According to an embodiment, the upper contact plugs 170 of the upper wiring structures UI are formed by partially forming the cell region insulating layer 290, partially removing the cell region insulating layer 290 by etching, and filling the removed region with a conductive material. The upper wiring lines 180 are formed by, for example, depositing a conductive material and patterning the conductive material.

Accordingly, the semiconductor device 100 according to an embodiment in FIGS. 1 to 3B can be manufactured.

Figure 11A:
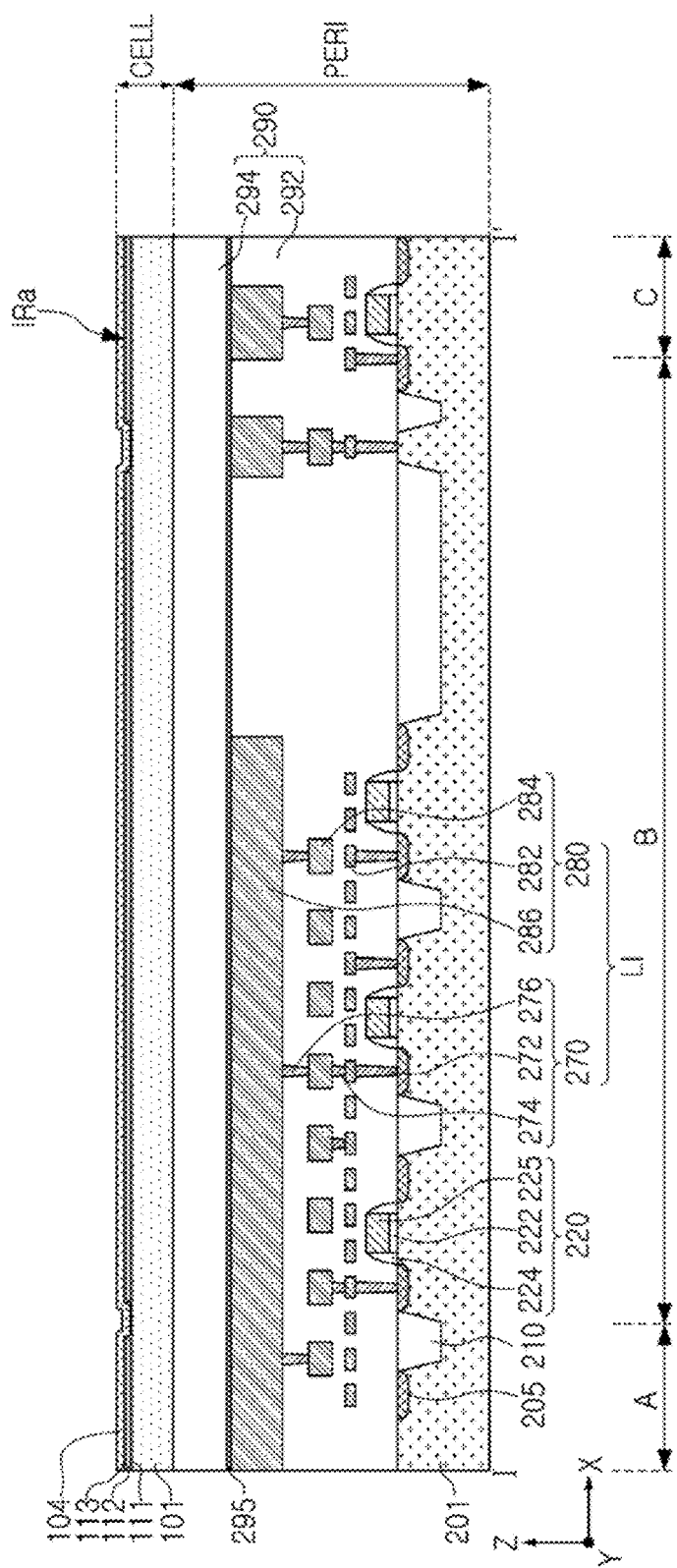
FIGS. 11A to 11C illustrate a method of manufacturing a semiconductor device according to an exemplary embodiment of the present disclosure.
Figure 11B:
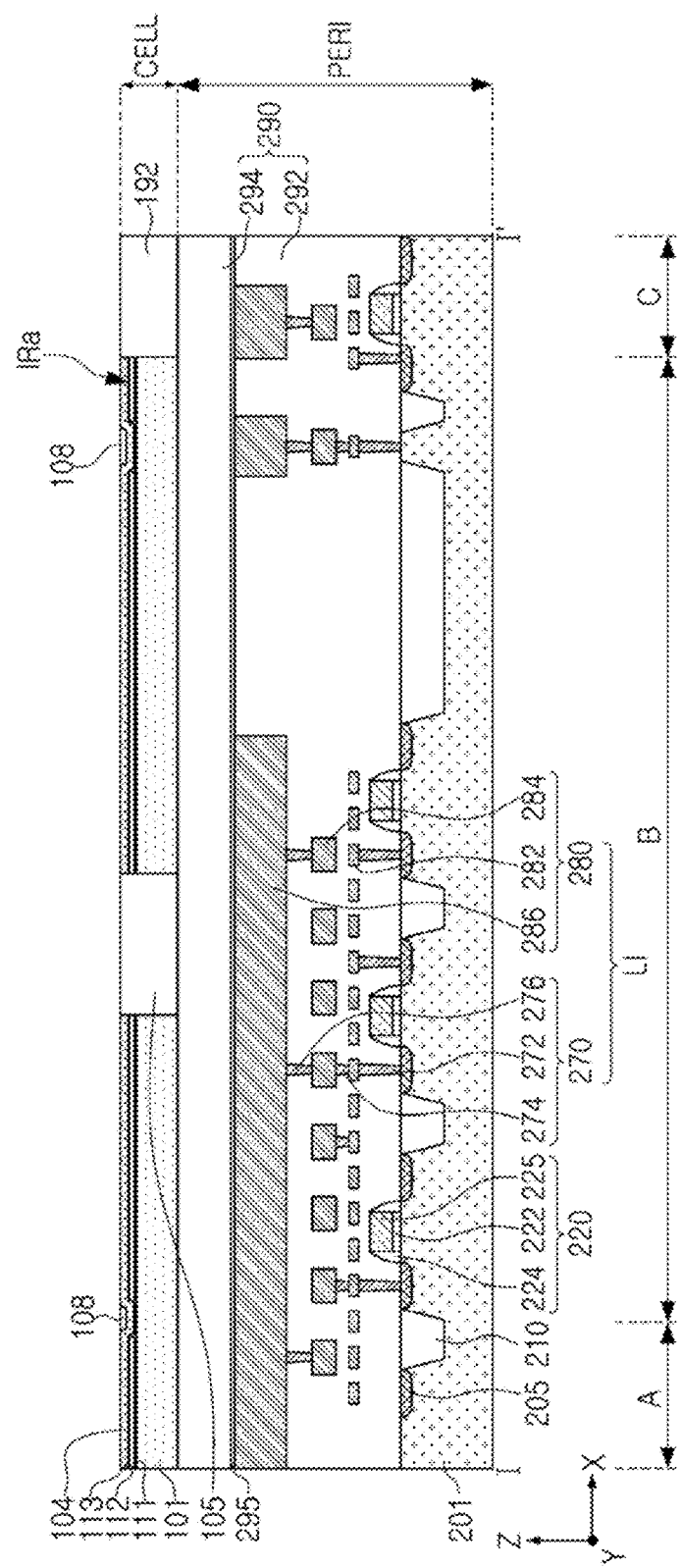
Figure 11C:
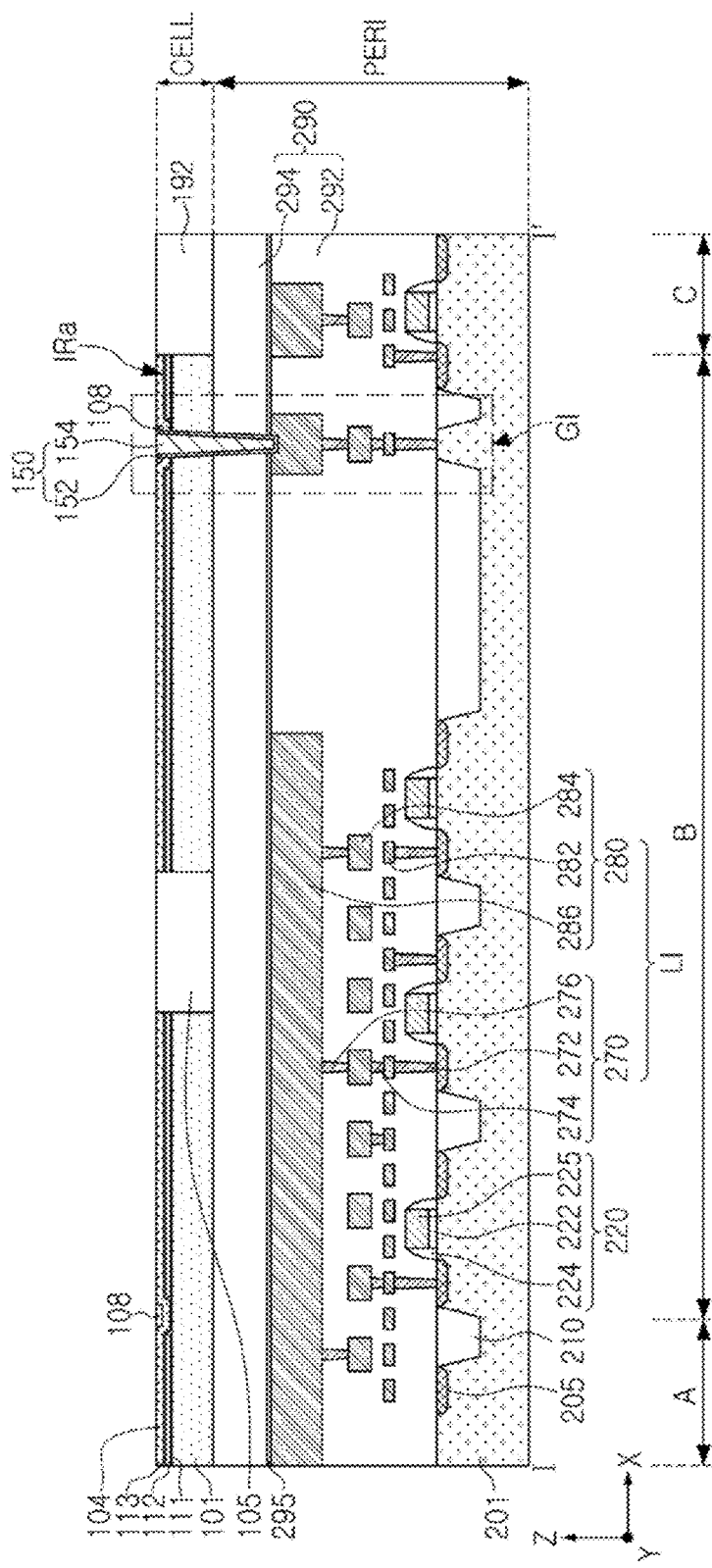

FIGS. 11A to 11C illustrate a method of manufacturing a semiconductor device according to an exemplary embodiment, illustrating regions shown in FIG. 4A.

Referring to FIG. 11A, according to an embodiment, the same processes as those described with reference to FIGS. 10A to 10C are performed. Thereafter, a third horizontal sacrificial layer 113 and a second horizontal conductive layer 104 are sequentially formed on an opening OP from which first and second horizontal sacrificial layers 111 and 112 have been removed.

According to an embodiment, the third horizontal sacrificial layer 113 covers an upper surface of the second horizontal sacrificial layer 112, is in contact with the second substrate 101 in the opening OP, and covers the exposed upper surface of the second substrate 101. By forming the third horizontal sacrificial layer 113, an insulating region IRa is formed that includes the first to third horizontal sacrificial layers 111, 112, and 113. The insulating region IRa has a first region in which the first to third horizontal sacrificial layers 111, 112, and 113 are stacked, and a second region in which the third horizontal sacrificial layer 113 is disposed in contact with the second substrate 101. The third horizontal sacrificial layer 113 has a stepped shape at ends of the first and second horizontal sacrificial layers 111 and 112, which are a boundary between the first region and the second region.

According to an embodiment, the second horizontal conductive layer 104 is formed on the third horizontal sacrificial layer 113. The second horizontal conductive layer 104 has a stepped shape along a profile of the third horizontal sacrificial layer 113 and has an uneven upper surface.

Referring to FIG. 11B, according to an embodiment, a planarization insulating layer 108 is formed on a portion of the second horizontal conductive layer 104.

According to an embodiment, the planarization insulating layer 108 is formed by depositing an insulating material on the second horizontal conductive layer 104 and performing a planarization process. The planarization insulating layer 108 fills a concave region formed by stepped portions in the second horizontal conductive layer 104. An upper surface of the planarization insulating layer 108 is substantially coplanar with an upper surface of the second horizontal conductive layer 104.

In a process according to an embodiment, a stacked structure of the second substrate 101, the first to third horizontal sacrificial layers 111, 112, and 113, and the second horizontal conductive layer 104 is patterned, and the substrate insulating layer 105 and the first cell region insulating layer 192 are partially formed.

Referring to FIG. 11C, according to an embodiment, by forming the upper via 150, a ground wiring structure GI is formed.

According to an embodiment, the upper via 150 is formed by forming a via hole by partially removing the planarization insulating layer 108, the second horizontal conductive layer 104, the insulating region Ira, the second substrate 101, the second peripheral region insulating layer 294, and the lower protective layer 295, and sequentially depositing the barrier layer 152 and the via conductive layer 154 in the via hole. The via hole penetrates the second region of the insulating region IRa in which the third horizontal sacrificial layer 113 is disposed in the exemplary embodiment illustrated in FIG. 11C, but embodiments are not limited thereto. In exemplary embodiments, the via hole penetrates the first region in which the first to third horizontal sacrificial layers 111, 112, and 113 are stacked.

Thereafter, the processes described with reference to FIGS. 10G to 10K are performed such that the semiconductor device 100a according to an embodiment shown in FIGS. 4A and 4B is manufactured.

According to aforementioned exemplary embodiments, by optimizing an insulating region and a horizontal conductive layer disposed on a second substrate, and a structure of an upper via that penetrates the insulating region and the horizontal conductive layer, a semiconductor device having improved reliability can be provided.

While exemplary embodiments have been illustrated and described above, it will be apparent to those skilled in the art that modifications and variations can be made without departing from the scope of embodiments of the present disclosure as defined by the appended claims.

What is claimed is:

1. A semiconductor device, comprising:
   a peripheral circuit region that includes
     a first substrate,
     circuit devices disposed on the first substrate, and
     a first wiring structure that is electrically connected to the circuit devices;
   a memory cell region that includes
     a second substrate disposed above the first substrate and that has a first region and a second region,
     gate electrodes that are stacked in a first direction perpendicular to an upper surface of the second substrate, are spaced apart from each other in the first region and that extend in a second direction perpendicular to the first direction and form a staircase shape in the second region,
     interlayer insulating layers alternately stacked with the gate electrodes,
     channel structures that extend in the first direction perpendicular to the second substrate, penetrate the gate electrodes, and include a channel layer,
     a first horizontal conductive layer disposed on the second substrate in the first region;

an insulating region disposed in the second region on the second substrate, wherein the insulating region is outside the gate electrodes, a second horizontal conductive layer disposed on the first horizontal conductive layer and the insulating region, wherein the second horizontal conductive layer includes a semiconductor, and a second wiring structure electrically connected to the gate electrodes and the channel structures; and a third wiring structure that connects the first substrate to the second substrate, and that includes an upper via that extends in the first direction and penetrates the second horizontal conductive layer, the insulating region, and the second substrate, and a lower wiring structure below the upper via and connected to the upper via, wherein a structure of the lower wiring structure corresponds to a structure of the first wiring structure, wherein an upper surface of the upper via is on a level lower than a level of a lower surface of a lowermost gate electrode of the gate electrodes.

2. The semiconductor device of claim 1, wherein the second horizontal conductive layer has a substantially planar upper surface in the first region and the second region.

3. The semiconductor device of claim 1, wherein the insulating region includes:

a first horizontal sacrificial layer, a second horizontal sacrificial layer, and a third horizontal sacrificial layer, that are sequentially stacked on the second substrate in a portion of the second region; and a supporting insulating layer disposed horizontally side by side with the first horizontal sacrificial layer and the second horizontal sacrificial layer in a portion of the second region adjacent to the upper via.

4. The semiconductor device of claim 3, wherein the third horizontal sacrificial layer extends onto the supporting insulating layer.

5. The semiconductor device of claim 4, wherein the upper via penetrates the third horizontal sacrificial layer and the supporting insulating layer of the insulating region.

6. The semiconductor device of claim 1, wherein the upper via includes:

a barrier layer that covers an internal side surface and a bottom surface of a via hole; and a via conductive layer disposed on the barer layer and that fills the via hole.

7. The semiconductor device of claim 6, wherein the barrier layer is in contact with a side surface of the second horizontal conductive layer and a side surface of the insulating region.

8. A semiconductor device, comprising:

a first substrate;

circuit devices disposed on the first substrate;

a first wiring structure electrically connected to the circuit devices;

a second substrate disposed above the first wiring structure;

gate electrodes stacked on the second substrate in a direction perpendicular to an upper surface of the second substrate and spaced apart from each other;

a horizontal conductive layer disposed below the gate electrodes on the second substrate;

channel structures that extend perpendicular to the second substrate and penetrate the gate electrodes, wherein each channel structure includes a channel layer; and a second wiring structure that connects the first substrate to the second substrate and that includes an upper via that extends towards the first substrate and penetrates the horizontal conductive layer and the second substrate, wherein the upper via is connected to the horizontal conductive layer and the second substrate through a side surface thereof, and wherein an upper surface of the upper via is on a level lower than a level of a lower surface of a lowermost gate electrode among the gate electrodes.

9. The semiconductor device of claim 8, wherein the second wiring structure further includes a lower wiring structure below the upper via and connected to the upper via, wherein the second wiring structure has a structure that corresponds to the first wiring structure.

10. The semiconductor device of claim 8, wherein the horizontal conductive layer has a substantially planar upper surface and a substantially planar lower surface.

11. A semiconductor device, comprising:

a peripheral circuit region that includes a first substrate, circuit devices disposed on the first substrate, and a first wiring structure that is electrically connected to the circuit devices;

a memory cell region that includes a second substrate disposed above the first substrate, gate electrodes stacked on the second substrate in a direction perpendicular to an upper surface of the second substrate and spaced apart from each other, channel structures that extend perpendicular to the second substrate, penetrate the gate electrodes, and include a channel layer, a first horizontal conductive layer and a second horizontal conductive layer sequentially stacked on a first region of the second substrate, wherein the second horizontal conductive layer includes a semiconductor and extends into a second region of the substrate, an insulating region disposed below the second horizontal conductive layer in the second region of the second substrate and that includes a plurality of horizontal sacrificial layers, wherein the insulating region is outside the gate electrodes, and a second wiring structure that is electrically connected to the gate electrodes and the channel structures; and a third wiring structure that connects the first substrate to the second substrate, and that includes an upper via that extends toward the first substrate and penetrates the second horizontal conductive layer, the insulating region, and the second substrate in the second region of the second substrate, wherein an upper surface of the upper via is on a level lower than a level of a lower surface of a lowermost gate electrode among the gate electrodes.

12. The semiconductor device of claim 11, wherein the upper via electrically connects the second horizontal conductive layer, the second substrate, and the first substrate to each other.

13. The semiconductor device of claim 11, further comprising:

a through via that penetrates the gate electrodes and a peripheral region insulating layer disposed below the gate electrodes and that electrically connects the first wiring structure to the second wiring structure, wherein the through via includes a lower through via located at a level that corresponds to a level of the upper via and that includes a material that is the same as a material of the upper via, and an upper through via disposed on the lower through via.

* * * * *